US009034557B2

(12) United States Patent
Dimov et al.

(10) Patent No.: US 9,034,557 B2
(45) Date of Patent: May 19, 2015

(54) CHEMICALLY AMPLIFIED POSITIVE PHOTORESIST COMPOSITION

(75) Inventors: Ognian N. Dimov, Warwick, RI (US); Binod B. De, Attleboro, MA (US)

(73) Assignee: FUJIFILM ELECTRONIC MATERIALS U.S.A., INC., North Kingstown, RI (US)

( * ) Notice: Subject to any disclaimer, the term of this patent is extended or adjusted under 35 U.S.C. 154(b) by 581 days.

(21) Appl. No.: 12/791,397

(22) Filed: Jun. 1, 2010

(65) Prior Publication Data

US 2010/0304299 A1 Dec. 2, 2010

Related U.S. Application Data

(60) Provisional application No. 61/182,911, filed on Jun. 1, 2009.

(51) Int. Cl.
| | | |
|---|---|---|
| G03F 7/004 | (2006.01) | |
| G03F 7/039 | (2006.01) | |
| G03F 7/20 | (2006.01) | |

(52) U.S. Cl.
CPC ............ *G03F 7/0045* (2013.01); *G03F 7/0392* (2013.01); *G03F 7/0397* (2013.01)

(58) Field of Classification Search
USPC ............... 430/270.1, 326; 540/484, 485, 492, 540/500, 504, 515; 558/315; 570/111, 113
See application file for complete search history.

(56) References Cited

U.S. PATENT DOCUMENTS

| | | | |
|---|---|---|---|
| 5,403,690 A | 4/1995 | Kuramoto et al. | |
| 5,629,134 A | 5/1997 | Oikawa et al. | |
| 5,744,281 A | 4/1998 | Niki et al. | |
| 5,994,022 A * | 11/1999 | Tanabe et al. | 430/170 |
| 6,071,670 A * | 6/2000 | Ushirogouchi et al. | 430/270.1 |
| 6,136,500 A | 10/2000 | Kobayashi et al. | |
| 6,165,678 A * | 12/2000 | Allen et al. | 430/270.1 |
| 6,251,558 B1 | 6/2001 | Elian et al. | |
| 6,280,900 B1 | 8/2001 | Chiba et al. | |
| 6,300,035 B1 | 10/2001 | Thackeray et al. | |
| 6,319,649 B1 | 11/2001 | Kato et al. | |
| 6,767,688 B2 | 7/2004 | Teng et al. | |
| 7,396,633 B2 | 7/2008 | Nagahara et al. | |
| 7,479,361 B2 | 1/2009 | Nagahara et al. | |
| 2002/0006578 A1 * | 1/2002 | Kodama et al. | 430/270.1 |
| 2005/0008968 A1 | 1/2005 | Watanabe et al. | |
| 2006/0210921 A1 | 9/2006 | Watanabe | |
| 2007/0026343 A1 * | 2/2007 | Tarutani | 430/270.1 |
| 2007/0048660 A1 | 3/2007 | Nozaki et al. | |
| 2008/0085473 A1 * | 4/2008 | Ito | 430/319 |
| 2008/0153030 A1 | 6/2008 | Kobayashi et al. | |
| 2008/0158675 A1 | 7/2008 | Fukushige et al. | |
| 2008/0241736 A1 * | 10/2008 | Kobayashi et al. | 430/270.1 |
| 2008/0268370 A1 | 10/2008 | Tanaka et al. | |

FOREIGN PATENT DOCUMENTS

| | | |
|---|---|---|
| JP | 06-236041 | 8/1994 |
| JP | 2000330284 | 11/2000 |
| JP | 2006025890 | 2/2006 |
| JP | 2007-163767 | 6/2007 |
| JP | 2007177192 | 7/2007 |
| JP | 2008064909 | 3/2008 |
| JP | 2008129388 | 6/2008 |
| KR | 20040079758 | 9/2004 |
| WO | WO 98/38195 | 9/1998 |
| WO | WO 03/104199 | 12/2003 |

OTHER PUBLICATIONS

Ferreira et al., "Choice of Amines as Stabilizers for Chemically Amplified Resist Systems", Proceedings of SPIE, vol. 3333, pp. 236-244. (1998).*
International Search Report Application No. PCT/US10/36868, dated Aug. 13, 2010.
Ferreira, L., et al., "Choice of Amines as Stabilizers for Chemically Amplified Resist Systems", Olin Microelectronic Materials, E. Providence, RI, SPIE vol. 3333, pp. 236-244.
Endo, Y. et al., "Reaction of Benzene with Diphenyl Sulfoxides," Faculty of Pharmaceutical Sciences, Univ. of Tokyo, Tokyo, Japan, vol. 29, Aug. 27, 1981, pp. 3753-3755.
PCT International Preliminary Report on Patentability for related PCT Patent Application No. PCT/US2010/036868, Dec. 15, 2011, 7 pgs.
Supplementary European Search Report and Written Opinion from EP 10 78 3909 completed on Oct. 30, 2012, 6 pgs.
Office Action from Japanese Patent Application No. 2012-513356 mailed Jul. 22, 2014 3 pgs.
Search Report and Written Opinion from Singapore Application No. 201108287-2 mailed Aug. 5, 2014, 19 pgs.
Search Report from Taiwan Application No. 99117405 mailed Jul. 22, 2014, 1 pgs.

* cited by examiner

*Primary Examiner* — Anca Eoff
(74) *Attorney, Agent, or Firm* — Blakely, Sokoloff, Taylor & Zafman, LLP

(57) ABSTRACT

A photoresist composition. The composition has the following: (a) one or more resin binders that include one or more acid sensitive groups and that are substantially free of phenolic groups protected by acetal or ketal groups; (b) one or more photo acid generators, that, upon exposure to a source of high energy, decompose and generate a photoacid strong enough to remove the one or more acid sensitive groups; (c) one or more ionic non-photosensitive additives including an iminium salt; and (d) one or more solvents. There is also a process for patterning relief structures on a substrate employing the photoresist composition.

27 Claims, No Drawings

CHEMICALLY AMPLIFIED POSITIVE PHOTORESIST COMPOSITION

RELATED APPLICATIONS

This application claims priority from U.S. Provisional Patent Application No. 61/182911 filed Jun. 1, 2009.

FIELD OF THE DISCLOSURE

The present invention provides new chemically amplified photoresist compositions comprising a non photo sensitive salt additive, and a patterning process employing said compositions.

BACKGROUND OF THE DISCLOSURE

Microelectronic industries, as well as other related industries are constantly reducing the feature size for constructing microscopic structures. Effective lithographic techniques are essential in this quest and require constantly improved radiation sensitive materials (resists). In order to resolve smaller structures, the wavelength of the exposing light has been reduced into the deep UV regions of 248 nm, 193 nm and 157 nm in addition to exposure to EUV or x-ray radiation. As the patterns and wavelengths become finer, the material properties of the resists used for pattern delineation have become more and more demanding. In particular, requirements of sensitivity, transparency, aesthetics of the image produced, and the selectivity of the resists to etch conditions for pattern transfer become more and more strenuous.

Chemically amplified resists are used extensively for optical lithography and electron-beam writing (see "Solid State Technology," Vol. 34 (1991), no. 8, pages 53 to 60) in the semiconductor industry. Chemically amplified resists operate on the principle of acid-catalyzed cleavage, wherein polar alkali solubilizing but blocked chemical groups, (e.g. carboxyl groups or phenolic hydroxyl groups) are unblocked by means of a photolytically generated acid. The resist changes polarity in the exposed regions and in many cases becomes alkali soluble. This change in polarity can be used, for example, to develop the resist in various ways, including an alkaline developer or—in the case of dry-developable resists—for selective silylation followed by oxidative plasma etching.

To satisfactorily obtain such acid catalyzed deblocking, the acid must diffuse in the solid state polymer matrix. The acid diffusion obtained is a function of numerous complicated and interacting variables. Examples of such various include acid strength, acid size, acid volatility, resin functional groups, time between exposure and post exposure bake, time and temperature of post exposure back, polymer functional groups and the presence or absence of basic or acidic contamination.

To obtain high resolution, in particular for pattern dimensions<0.25 um, control of the diffusion of the photoacid generated by exposure, is critical. Too much lateral diffusion produces narrow lines and too little lateral diffusion produces lines that are too wide. In addition it is necessary to control the diffusion vertically to generate vertical profiles despite exposures and absorptions that tend to generate a vertical exposure gradient. Similarly, basic contamination from the substrate or the atmosphere can generate photoacid neutralizing gradients in the resist, which need to be overcome.

The present invention provides new photoresist compositions comprising a non photo sensitive acid generating additive which provides a combination of high resolution, high photospeed, good exposure latitude, good depth of focus and good profiles.

Furthermore, photosensitive compositions wherein the resin binder contains an anhydride or a lactone group show significantly improved shelf life.

SUMMARY OF THE INVENTION

The present invention provides novel photoresist compositions comprising:
1) a resin binder, or a mixture of resin binders, which become alkali-soluble by the action of an acid to remove protecting acid sensitive groups on the resin,
2) at least one photo acid generator (PAG), which upon exposure to a source of high energy, decomposes and generates an acid (photoacid), strong enough to remove the protecting acid sensitive groups on the resin,
3) at least one, ionic non-photosensitive additive comprising an iminium salt optionally substituted with one or more additional heteroatoms;
4) at least one solvent; and
4) optionally at least one base as a quencher,
with the proviso that the resin binder or mixture of resin binders does not include phenolic groups protected by acetal or ketal groups.

The photoresist composition may further contain a sensitizer which causes an increase in high light yield and one or a mixture of surfactants for improving film quality.

In one embodiment, the ionic non-photosensitive additive in the photoresist composition is an iminium salt of Structure $I_0$ ($B^+ A_0^-$) wherein $B^+$ is

wherein $R_a$ and $R_b$, are substituted or unsubstituted alkyl groups and may contain carbonyl groups, or contain S atoms, O atoms, or $NR_e$ groups within the chain; $R_c$ and $R_d$ are hydrogen or an alkyl group which may contain S atoms, O atoms, or $NR_e$ groups within the chain; $R_a$ and $R_b$, or $R_a$ and $R_c$, or $R_c$ and $R_d$, or $R_b$ and $R_d$ may combine to form a 5-7 membered ring which may contain S atoms, O atoms, or $NR_e$ groups within the ring; $R_e$ may be hydrogen or an alkyl group; and $A_0^-$ is selected from the group consisting of compounds having an organic sulfonic acid anion, compounds having a sulfamic acid anion, compounds having a carboxylic anion, compounds having an alkyl sulfate anion, compounds having a bis sulfonylimide anion, and compounds having a tris sulfonyl anion.

In one embodiment, the ionic non-photosensitive additive in the photoresist composition is a compound of Structure $I_0$ ($B^+A_0^-$) wherein the acid generated upon photoactivation and $A_0^-$ $H^+$ differ in pKa values by at least about 0.5.

In one embodiment, the basicity ($pK_b$) of the (optional) quencher in the photoresist composition and the conjugate base of the cation of the iminium salt differ in pKb values by at least about 0.5.

In one embodiment, the ionic non-photosensitive additive in the photoresist composition is a compound of Structure $I_0$ ($B^+A_0^-$) and increases the shelf life of resists comprising easily hydrolysable functional groups.

Another embodiment of this invention is a patterning process for production of relief structures on a substrate that comprises: providing a substrate; coating a photosensitive composition of this invention as described herein before on said substrate; baking the photosensitive composition to provide a photosensitive film on the substrate; exposing the photosensitive film to imaging radiation; developing the photosensitive film making a portion of the underlying substrate visible; and rinsing the coated, exposed and developed substrate;

DETAILED DESCRIPTION OF THE INVENTION

The present invention relates to a photoresist composition sensitive to radiation in the deep ultraviolet or EUV. It is an object of this disclosure to obtain a photoresist composition with high performance lithographic imaging and high formulation latitude.

Definition of Terms

The terms salt and ionic compound are used interchangeably. Similarly the terms protected and blocked, and deprotected and unblocked, are interchangeable. Unless otherwise stated, the term % refers to weight %.

The term 'acid sensitive group' is defined to mean a functional group which reacts more than 5 molar % in the presence of an acid such as carboxylic or sulfonic acid under bake conditions of up to 160° C. for a duration of up to 10 minutes to yield a new functional group that increases the polymer's solubility in aqueous alkali developer solutions.

The term heteroatom is defined as N, O, and S atoms.

For the purposes of this disclosure, the term iminium group is defined as a positively charged nitrogen double bonded to a carbon and singly bonded to two other atoms which are either a carbon or a hydrogen and does not reside within an aromatic ring.

The term non-photosensitive in the context of this disclosure means that the compound upon exposure does not generate a significant amount of photoacid nor generates an intermediate that significantly decomposes the PAG.

It has been found that the addition of the non-photosensitive iminium salt additive to photoresists can provide highly resolved relief images of small dimensions, including lines of sub-micron and sub-half micron dimensions with vertical or essentially vertical side walls. It also has been found that the non-photosensitive iminium salt additive can enhance the imaging performance of photoresist composition in different ways such as improvement of resolution, process window, and line edge roughness, as well as reduction in standing waves and scum between lines.

In one embodiment, the ionic non-photosensitive additive in the photoresist composition is an iminium salt of Structure $I_0$ ($B^+A_0^-$) wherein $B^+$ is

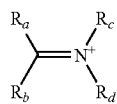

$I_0$ wherein $R_a$ and $R_b$, are substituted or unsubstituted alkyl groups and may contain carbonyl groups, or contain S atoms, O atoms, or $NR_e$ groups within the chain; $R_c$ and $R_d$ are hydrogen or an alkyl group which may contain S atoms, O atoms, or $NR_e$ groups within the chain; $R_a$ and $R_b$, or $R_a$ and $R_c$, or $R_c$ and $R_d$, or $R_b$ and $R_d$ may combine to form a 5-7 membered ring which may contain S atoms, O atoms, or $NR_e$ groups within the ring; $R_e$ may be hydrogen or an alkyl group; and $A_0^-$ is selected from the group consisting of compounds having an organic sulfonic acid anion, compounds having a sulfamic acid anion, compounds having a carboxylic anion, compounds having an alkyl sulfate anion, compounds having a bis sulfonylimide anion, and compounds having a bis sulfonyl anion. Cations $B^+$ can be made by the alkylation or protonation of certain classes of compounds such as pyroles, oxazoles, imidazoles, pyrrolines, and pyrolidines.

In a preferred embodiment, the ionic non-photosensitive additive in the photoresist composition is an iminium salt of Structure I ($B^+$ $A^-$) wherein $A^-$ is a organic sulfonic acid anion ($R^{11}SO_3^-$) or a sulfamic acid anion [$R^{12}N(R^{13})SO_3^-$] or a carboxylic acid anion ($R^{14}CO_2^-$) or an alkyl sulfate ($R^{15}SO_4^-$) or a bis sulfonyl imide anion [$(R^{16}SO_2)_2N^-$] or a tris sulfonyl methide anion [$(R^{16}SO_2)_3C^-$]; where $R^{11}$, $R^{12}$, $R^{13}$, $R^{14}$ and $R^{15}$ are independently a $C_1$-$C_{24}$ carbon chain or partially or fully halogen substituted carbon chain, unsubstituted or substituted $C_6$-$C_{20}$ aromatic carbon chain or combinations thereof, optionally containing S or N or any organic functional group that may interrupt the skeletal chain; $R^{16}$ is independently selected from the group consisting of highly fluorinated or perfluorinated alkyl or fluorinated aryl groups and may be cyclic, when a combination of any two $R^{16}$ groups are linked to form a bridge, further, the $R^{16}$ alkyl chains contain from 1-20 carbon atoms and may be straight, branched, or cyclic, such that divalent oxygen, trivalent nitrogen or hexavalent sulfur may interrupt the skeletal chain, further when $R^{16}$ contains a cyclic structure, such structure has 5 or 6 ring members, optionally, 1 or 2 of which are heteroatoms.

In a more preferred embodiment, the ionic non-photosensitive additive in the photoresist composition is an iminium salt of $B_1^+A^-$ (Structure IA) or $B_2^+A$ (Structure ID):

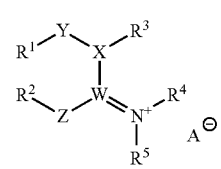

Structure IA wherein W is a carbon atom, X is a $R^6C$ group or nitrogen atom or a hetero atom, Y is a $(R^7)_2C$ or a carbonyl group, or a S or O atom, Z is a $(R^8)_2C$ group, $R^9N$, or a S or O atom, $R^1$ to $R^9$ are independently a hydrogen atom, $C_1$-$C_3$ carbon chain or a 5 to 7 member ring, $R^1$ and $R^2$ may connected together to form a 5-7 member ring, similarly $R^3$ and $R^4$ may form a 5-7 member ring if connected together. $A^-$ is a organic sulfonic acid anion ($R^{11}SO_3^-$) or a sulfamic acid anion [$R^{12}N(R^{13})SO_3^-$] or a carboxylic acid anion ($R^{14}CO_2^-$) or an alkyl sulfate ($R^{15}SO_4^-$) or a bis sulfonyl imide anion [$(R^{16}SO_2)_2N^-$] or a tris sulfonyl methide anion [$(R^{16}SO_2)_3C^-$]; where $R^{11}$, $R^{12}$, $R^{13}$, $R^{14}$ and $R^{15}$ are independently a $C_1$-$C_{24}$ carbon chain or partially or fully halogen substituted carbon chain, unsubstituted or substituted $C_6$-$C_{20}$ aromatic carbon chain or combinations thereof, optionally containing S or N or any organic functional group that may interrupt the skeletal chain; $R^{16}$ is independently selected from the group consisting of highly fluorinated or perfluorinated alkyl or fluorinated aryl groups and may be cyclic, when a combination of any two $R^{16}$ groups are linked to form a bridge, further, the $R^{16}$ alkyl chains contain from 1-20 carbon atoms and may be straight, branched, or cyclic, such that divalent oxygen, trivalent nitrogen or hexavalent sulfur may interrupt the skeletal chain, further when $R^{16}$ contains a cyclic structure, such structure has 5 or 6 ring members, optionally, 1 or 2 of which are heteroatoms;

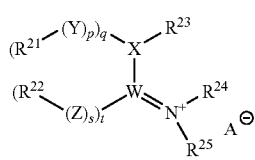

ID wherein W is a carbon atom, X is a $R^{26}C$ group or nitrogen atom or a hetero atom, Y is a $(R^{27})_2C$ or a carbonyl group, or a S or O atom, Z is a $(R^{28})_2C$ group, $R^{29}N$, or a S or O atom, $R^{21}$ to $R^{29}$ are independently a hydrogen atom, a phenyl group, a $C_1$-$C_3$ carbon chain optionally substituted with a phenyl group or a 5 to 7 member ring, $R^{21}$ and $R^{22}$ may connected together to form a 5-7 member ring, similarly $R^{23}$ and $R^{24}$ may form a 5-7 member ring if connected together, p, q, s, and t are independently 0 or 1 ; $A^-$ is as described above.

In an even more preferred embodiment, the ionic non-photosensitive additive in the photoresist composition is an iminium salt of Structure IA where X=N and Z is a $(R^8)_2C$ group or a $R^9N$ group. Structure IA where X=N and Z is a $(R^8)_2C$ group corresponds to an amidinium salt (Structure IB). Structure IA where X=N and Z is a $R^9N$ group corresponds to a guanadinium salt (Structure IC).

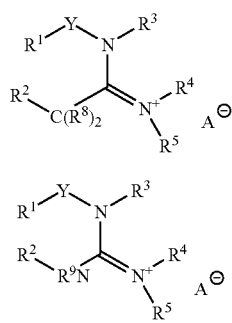

IB

IC

In another even more preferred embodiment, the ionic non-photosensitive additive in the photoresist composition is an iminium salt of Structure ID where X=N, $R^{22}$ is a phenyl group, S=0, and t=1.

In a most preferred embodiment, the ionic non-photosensitive additive in the photoresist composition is an iminium salt of Structure IA where X=N and Z is a $(R^8)_2C$ group and where $R^{11}$, $R^{12}$, $R^{13}$, $R^{14}$ and $R^{15}$ are independently a $C_1$-$C_8$ carbon chain or partially or fully halogen substituted carbon chain, unsubstituted or substituted $C_6$-$C_{10}$ aromatic carbon chain or combinations thereof, optionally containing S or N or any organic functional group that may interrupt the skeletal chain; $R^{16}$ is independently selected from the group consisting of highly fluorinated or perfluorinated alkyl or fluorinated aryl groups and may be cyclic, when a combination of any two $R^{16}$ groups are linked to form a bridge, further, the $R^{16}$ alkyl chains contain from 1-10 carbon atoms and may be straight, branched, or cyclic, such that divalent oxygen, trivalent nitrogen or hexavalent sulfur may interrupt the skeletal chain, further when $R^{16}$ contains a cyclic structure, such structure has 5 or 6 ring members, optionally, 1 or 2 of which are heteroatoms.

Iminium cations of can be made by alkylation of the corresponding imine or imine derivative or by the reaction of the corresponding imine or imine derivative with acid. If required, anion exchange can be performed by standard methods known to those skilled in the art to produce the desired salt.

Examples of imines and imine derivatives which can be converted to the iminium cations ($B^+$) include, but are not limited to the compounds shown below.

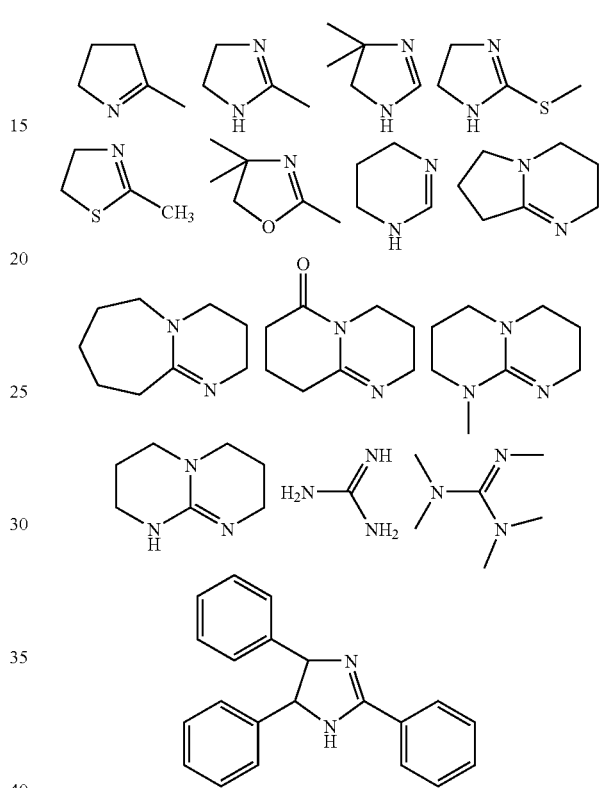

Suitable examples of sulfonic acids which can react with imine or imine derivatives to produce iminium salts include, but are not limited to, methane sulfonic acid, ethane sulfonic acid, benzene sulfonic acid, toluene sulfonic acid, camphor sulfonic acid, 4-dodecane benzene sulfonic acid, 1,2-ethanedisulfonic acid trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, and fluorinated ether sulfonic acids such as 1,1,2,2-tetrafluoro-2-(trifluoromethoxy)-ethanesulfonic acid, 2,2'-[(difluoromethylene)bis(oxy)]bis[1,1,2,2-tetrafluoro-ethanesulfonic acid, 1,1,2,2-tetrafluoro-2-(1,1,2,2,3,4,4,4-octafluoro-3-ethanesulfonic acid, and 1,1,2,2,3,3-hexafluoro-3-(phenoxysulfonyl)propane-1-sulfonic acid.

Suitable examples of carboxylic acids which can react with imine or imine derivatives to produce iminium salts include, but are not limited to, acetic, propionic, benzoic, benzylic, trimethylacetic, succinic, ethoxyacetic, lactic, glycolic, citric, tartaric, malic, butyric, valeric, cyclohexylacetic, hydroxybutyric, fluroacetic, trifluoacetic, pentafluoropropionic, and toluic.

Suitable examples of sulfamic acids which can react with imine or imine derivatives to produce iminium salts include, but are not limited to, cyclohexylsulfamic, dicyclohexylsulfamic, methylsulfamic, dimethylsulfamic, ethyl sulfamic, diethyl sulfamic, n-propylsulfamic, isopropylsulfamic, n-butylsulfamic, n-dibutylsulfamic, sec.-butylsulfamic, isobutylsulfamic, 1-ethyl-propyl-1-sulfamic, n-pentylsulfamic, cyclopentylsulfamic, n-hexylsulfamic, cycloheptylsulfamic, 1-ethyl-2-methylpropylsulfamic, 1-cyclohexyl-1-ethylsulfamic, 1-(2'-norbornyl)ethylsulfamic, and benzylsulfamic.

Suitable examples of sulfates which can react with imine or imine derivatives to produce iminium salts include, but are not limited to, methyl hydrogen sulfate, ethyl hydrogen sulfate, propyl hydrogen sulfate, butyl hydrogen sulfate, benzyl hydrogen sulfate and phenyl hydrogen sulfate.

Suitable examples of bis sulfonyl imides which can react with imine or imine derivatives to produce iminium salts include, but are not limited to, bis(perfluorocyclohexylsulfonyl)imide, $(CF_3(CF_2)_2SO_2)NH(SO_2(CF_2)_2CF_3)$, $(CF_3(CF_2)_7SO_2)NH(SO_2(CF_2)_2CF_3)$, $(CF_3(CF_2)_7SO_2)NH(SO_2(CF_2)_7CF_3)$, $(CF_3(CF_2)_2SO_2)NH(SO_2CF_3)$, $(CF_3CF_2SO_2)NH(SO_2CF_3)$, $(CF_3(CF_2)_3SO_2)NH(SO_2(CF_2)_3CF_3)$, $(CF_3CF_2SO_2)NH(SO_2CF_2CF_3)$, $(CF_3SO_2)NH(SO_2CF_3)$, $(CF_3(CF_2)_7SO_2)NH(SO_2CF_3)$, and $(CF_3(CF_2)_3SO_2)NH(SO_2CF_3)$ and fluorinated ether bissulfonyl imides such as $(CF_3OCF_2CF_2SO_2)NH(SO_2CF_3)$, $(CF_3OCF_2CF_2SO_2)NH(SO_2CF_2CF_3)$, $(CF_3OCF_2CF_2SO_2)NH(SO_2CF_2CF_2CF_3)$, $(CF_3OCF_2CF_2SO_2)NH(SO_2CF_2CF_2CF_2CF_3)$, $(CF_3OCF_2CF_2SO_2)NH(SO_2CF_2\ CF_2OCF_3)$, $(CF_3OCF_2CF_2OCF_2CF_2SO_2)NH(SO_2CF_3)$, $(CF_3OCF_2CF_2OCF_2CF_2SO_2)NH(SO_2CF_2CF_3)$, $(CF_3OCF_2CF_2OCF_2CF_2SO_2)NH(SO_2CF_2\ CF_2\ CF_2CF_3)$, and $(CF_3CF_2OCF_2CF_2OCF_2CF_2SO_2)NH(SO_2CF_3)$ Suitable examples of tris sulfonyl methanes which can react with imine or imine derivatives to produce iminium salts include, but are not limited to, $(CF_3SO_2)_3CH$, $(CF_3CF_2SO_2)_3CH$, $(CF_3CF_2CF_2CF_2SO_2)_3CH$, $(CF_3CF_2CF_2SO_2)_3CH$, $(CF_3CF_2CF_2CF_2SO_2)(CF_3SO_2)_2CH$, $(C_6F_5SO_2)(CF_3SO_2)_2CH$, $[(CF_3)_2NC_2F_4SO_2]_2CH(SO_2CF_3)$, the protonated versions of

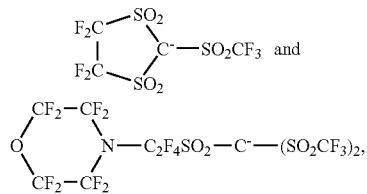

and fluorinated ether methides such as $(CF_3CF_2OCF_2CF_2SO_2)_3CH$, $(CF_3OCF_2CF_2SO_2)_3CH$, $(CF_3OCF_2CF_2SO_2)_2(CF_3SO_2)CH$, and $(CF_3CF_2OCF_2CF_2OCF_2CF_2SO_2)_3CH$.

Suitable examples of the additive include, but are not limited to salts of DBU (1,8-diazabicyclo[5.4.0]undec-7-ene) with the following sulfonic acids: bicyclo[2.2.1]heptane-1-methanesulfonic acid (camphorsulfonic acid), dodecyl-benzenesulfonic acid, toluenesulfonic acid, methane sulfonic acid, ethane sulfonic acid, benzene sulfonic acid, trifluoromethane sulfonic acid, 1,1,2,2-tetrafluoroethanesulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of DBN (1,5-diazabicyclo[4.3.0]non-5-ene) with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid,3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of TPI (2,4,5-triphenyl-4,5-dihydro-1H-imidazole) with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 2-phenyl-1H-benzimidazole with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid , 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 2,4,4-trimethyl-4,5-dihydro-1,3-oxazole with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid,3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 2-methyl-4,5-dihydro-1,3-thiazole with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 1,3,4,6,7,8-hexahydro-2H-pyrimido[1,2-a]pyrimidine with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 2,3,4,7,8,9-hexahydro-6H-pyrido[1,2-a]pyrimidin-6-one with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Additional suitable examples include salts of 1,1,2,3,3-pentamethylguanidine with the following sulfonic acids: camphorsulfonic acid, dodecyl-benzenesulfonic acid, toluenesulfonic acid, methane sulfonic acid, ethane sulfonic acid, benzene sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid.

Preferred sulfonic acid derived additives include salts of DBU (1,8-diazabicyclo[5.4.0]undec-7-ene) with the following sulfonic acids: camphorsulfonic acid, dodecyl-benzenesulfonic acid, toluenesulfonic acid, methane sulfonic acid, trifluoromethane sulfonic acid, 1,1,2,2-tetrafluoroethanesulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid,1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Preferred sulfonic acid derived additives include salts of DBN (1,5-diazabicyclo[4.3.0]non-5-ene) with the following sulfonic acids: camphorsulfonic acid, dodecyl-benzenesulfonic acid, toluenesulfonic acid, methane sulfonic acid, ethane sulfonic acid, trifluoromethane sulfonic acid, pentafluoroethane sulfonic acid, 1,1,2,2,3,3,3-heptafluoropropane-1-sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid, 3-[(4-cyclohexylphenoxy)sulfonyl]-1,1,2,2,3,3-hexafluoropropane-1-sulfonic acid, 1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, 3-[(2-(adamantan-1-ylmethoxy)-1,1-difluoro-2-oxoethanesulfonic acid, and 2-[(adamantan-1-ylmethyl)amino]-1,1-difluoro-2-oxoethanesulfonic acid. Preferred sulfonic acid derived additives include salts of TPI (2,4,5-triphenyl-4,5-dihydro-1H-imidazole) with the following sulfonic acids: camphorsulfonic acid, dodecyl-benzenesulfonic acid, and toluenesulfonic acid. Preferred sulfonic acid derived additives include salts of 2-phenyl-1H-benzimidazole with the following acids: camphorsulfonic acid, dodecyl-benzenesulfonic acid, and toluenesulfonic acid. Preferred sulfonic acid derived additives include salts of 2,4,4-trimethyl-4,5-dihydro-1,3-oxazole with the following sulfonic acids: camphorsulfonic acid, dodecyl-benzenesulfonic acid, and toluenesulfonic acid. Preferred sulfonic acid derived additives include salts of 1,3,4,6,7,8-hexahydro-2H-pyrimido[1,2-a]pyrimidine with the following sulfonic acids: camphorsulfonic acid, dodecyl-benzenesulfonic acid, and toluenesulfonic acid. Preferred sulfonic acid derived additives include salts of 2,3,4,7,8,9-hexahydro-6H-pyrido[1,2-a]pyrimidin-6-one with the following sulfonic acids: camphorsulfonic acid, dodecyl-benzenesulfonic acid, and toluenesulfonic acid. Preferred sulfonic acid derived additives include salts of 1,1,2,3,3-pentamethylguanidine with the following sulfonic acids: camphorsulfonic acid, dodecyl-benzenesulfonic acid, and toluenesulfonic acid.

More preferred sulfonic acid derived additives include salts of DBU (1,8-diazabicyclo[5.4.0]undec-7-ene) with the following sulfonic acids: camphorsulfonic acid, dodecyl-benzenesulfonic acid, toluenesulfonic acid, methane sulfonic acid, trifluoromethane sulfonic acid, 1,1,2,2-tetrafluoroethanesulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid,3-[(4-cyclohexylphenoxy)sulfonyl]-1,1,2,2,3,3-hexafluoropropane-1-sulfonic acid,1,1,2,2,3,3-hexafluoro-3-(phenoxysulfonyl)propane-1-sulfonic acid, 3-[(4-cyclohexylphenoxy)sulfonyl]-1,1,2,2,3,3-hexafluoropropane-1-sulfonic acid, and 3-[(2-(adamantan-1-ylmethoxy)-1,1-difluoro-2-oxoethanesulfonic acid. More preferred sulfonic acid derived additives also include salts of DBN (1,5-diazabicyclo[4.3.0]non-5-ene) with the following sulfonic acids: camphorsulfonic acid, dodecyl-benzenesulfonic acid, toluenesulfonic acid, methane sulfonic acid, trifluoromethane sulfonic acid, 1,1,2,2,3,3,4,4,4-nonafluorobutane-1-sulfonic acid, 1,1,2,2,3,3,4,4,5,5,6,6,7,7,8,8,8-heptadecafluorooctane-1-sulfonic acid, 1,1,2,2,3,3-hexafluoro-3-(piperidin-1-ylsulfonyl)propane-1-sulfonic acid,34(4-cyclohexylphenoxy)sulfonyl]-1,1,2,2,3,3-hexafluoropropane-1-sulfonic acid,1,1,2,2,3,3-hexafluoro-3-(phenoxysulfonyl)propane-1-sulfonic acid, and 2-[(adamantan-1-ylmethyl)amino]-1,1-difluoro-2-oxoethanesulfonic acid. More preferred sulfonic acid derived additives also include salts of TPI (2,4,5-triphenyl-4,5-dihydro-1H-imidazole) with the following sulfonic acids: camphorsulfonic acid, dodecyl-benzenesulfonic acid, and toluenesulfonic acid. More preferred sulfonic acid derived additives also include a salt of 2-phenyl-1H-benzimidazole with the following sulfonic acids: camphorsulfonic acid, dodecyl-benzenesulfonic acid, and toluenesulfonic acid. More preferred sulfonic acid derived additives also include salts of 1,3,4,6,7,8-hexahydro-2H-pyrimido[1,2-a]pyrimidine with the following sulfonic acids: camphorsulfonic acid, dodecyl-benzenesulfonic acid, and toluenesulfonic acid. More preferred sulfonic acid derived additives also include salts of 1,1,2,3,3-pentamethylguanidine with the following sulfonic acids: camphorsulfonic acid, dodecyl-benzenesulfonic acid, and toluenesulfonic acid.

Suitable examples of the additive include, but are not limited to salts of DBU (1,8-diazabicyclo[5.4.0]undec-7-ene) with the following carboxylic acids: acetic acid, propionic acid, benzoic acid, toluic acid, trifluoroacetic acid, pentafluoropropanoic acid, and 2-ethylhexanoic acid. Additional suitable examples include salts of DBN (1,5-diazabicyclo[4.3.0] non-5-ene) with the following carboxylic acids: acetic acid, propionic acid, benzoic acid, toluic acid, trifluoroacetic acid, pentafluoropropanoic acid, and 2-ethylhexanoic acid. Additional suitable examples include salts of TPI (2,4,5-triphenyl-4,5-dihydro-1H-imidazole) with the following carboxylic acids: acetic acid, propionic acid, benzoic acid, toluic acid, trifluoroacetic acid, pentafluoropropanoic acid, and 2-ethylhexanoic acid. Additional suitable examples include salts of 2-phenyl-1H-benzimidazole with the following carboxylic acids: acetic acid, propionic acid, benzoic acid, toluic acid, trifluoroacetic acid, pentafluoropropanoic acid, and 2-ethylhexanoic acid. Additional suitable examples include salts of 2,4,4-trimethyl-4,5-dihydro-1,3-oxazole with the following carboxylic acids: acetic acid, propionic acid, benzoic acid, toluic acid, trifluoroacetic acid, pentafluoropropanoic acid, and 2-ethylhexanoic acid. Additional suitable examples include salts of 2-methyl-4,5-dihydro-1,3-thiazole with the following carboxylic acids: acetic acid, propionic acid, benzoic acid, toluic acid, trifluoroacetic acid, pentafluoropropanoic acid, and 2-ethylhexanoic acid. Additional suitable examples include salts of 1,3,4,6,7,8-hexahydro-2H-pyrimido[1,2-a]pyrimidine with the following carboxylic acids: acetic acid, propionic acid, benzoic acid, toluic acid, trifluoroacetic acid, pentafluoropropanoic acid, and 2-ethylhexanoic acid. Additional suitable examples include salts of 2,3,4,7,8,9-hexahydro-6H-pyrido[1,2-a]pyrimidin-6-one with the following carboxylic acids: acetic acid, propionic acid, benzoic acid, toluic acid, trifluoroacetic acid, pentafluoropropanoic acid, and 2-ethylhexanoic acid. Additional suitable examples include salts of 1,1,2,3,3-pentamethylguanidine with the following carboxylic acids: acetic acid, propionic acid, benzoic acid, toluic acid, trifluoroacetic acid, pentafluoropropanoic acid, and 2-ethylhexanoic acid.

Preferred carboxylic acid derived additives include salts of DBU (1,8-diazabicyclo[5.4.0]undec-7-ene) with the following carboxylic acids: trifluoroacetic acid, and 2-ethylhexanoic acid. Preferred carboxylic acid derived additives also include salts of 1,1,2,3,3-pentamethylguanidine with the following carboxylic acids: trifluoroacetic acid, pentafluoropropanoic acid, and 2-ethylhexanoic acid. Additional suitable examples include salts of TPI (2,4,5-triphenyl-4,5-dihydro-1H-imidazole) with the following carboxylic acid: trifluoroacetic acid. Preferred carboxylic acid derived additives also include salts of 2-phenyl-1H-benzimidazole with the following carboxylic acid: trifluoroacetic acid. Preferred carboxylic acid derived additives also include salts of 2,4,4-trimethyl-4,5-dihydro-1,3-oxazole with the following carboxylic acid: trifluoroacetic acid. Preferred carboxylic acid derived additives also include salts of 2,4,4-trimethyl-4,5-dihydro-1,3-oxazole with the following carboxylic acid: trifluoroacetic acid. Preferred carboxylic acid derived additives also include salts of 1,3,4,6,7,8-hexahydro-2H-pyrimido[1,2-a]pyrimidine with the following carboxylic acid: trifluoroacetic acid. Preferred carboxylic acid derived additives also include salts of 2,3,4,7,8,9-hexahydro-6H-pyrido[1,2-a]pyrimidin-6-one with the following carboxylic acid: trifluoroacetic acid. Preferred carboxylic acid derived additives also include salts of 1,1,2,3,3-pentamethylguanidine with the following carboxylic acid: trifluoroacetic acid.

More preferred carboxylic acid derived additives include salts of DBU (1,8-diazabicyclo[5.4.0]undec-7-ene) with the following carboxylic acids: trifluoroacetic acid, pentafluoropropanoic acid, and 2-ethylhexanoic acid. More preferred carboxylic acid derived additives also include salts of 1,1,2,3,3-pentamethylguanidine with the following carboxylic acids: trifluoroacetic acid, pentafluoropropanoic acid, and 2-ethylhexanoic acid. More preferred carboxylic acid derived additives also include salts of TPI (2,4,5-triphenyl-4,5-dihydro-1H-imidazole) with the following carboxylic acid: trifluoroacetic acid. More preferred carboxylic acid derived additives also include salts of 2-phenyl-1H-benzimidazole with the following carboxylic acid: trifluoroacetic acid. More preferred carboxylic acid derived additives also include salts of 2,4,4-trimethyl-4,5-dihydro-1,3-oxazole with the following carboxylic acid: trifluoroacetic acid. More preferred carboxylic acid derived additives also include salts of 1,3,4,6,7,8-hexahydro-2H-pyrimido[1,2-a]pyrimidine with the following carboxylic acid: trifluoroacetic acid. More preferred carboxylic acid derived additives also include salts of 1,1,2,3,3-pentamethylguanidine with the following carboxylic acid: trifluoroacetic acid.

Suitable examples of the additive include, but are not limited to a salt of DBU (1,8-diazabicyclo[5.4.0]undec-7-ene) with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine.

Additional suitable examples include salts of DBN (1,5-diazabicyclo[4.3.0]non-5-ene) with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of TPI (2,4,5-triphenyl-4,5-dihydro-1H-imidazole) with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 2-phenyl-1H-benzimidazole with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 2,4,4-trimethyl-4,5-dihydro-1,3-oxazole with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 2-methyl-4,5-dihydro-1,3-thiazole with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 1,3,4,6,7,8-hexahydro-2H-pyrimido[1,2-a]pyrimidine with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 2,3,4,7,8,9-hexahydro-6H-pyrido[1,2-a]pyrimidin-6-one with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Additional suitable examples include salts of 1,1,2,3,3-pentamethylguanidine with the following trissulfonyl methanes: tris[(trifluoromethyl)sulfonyl]methane, tris[(pentafluoroethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine.

Preferred trissulfonyl methanes derived additives include salts of DBU (1,8-diazabicyclo[5.4.0]undec-7-ene) with the following trissulfonyl methanes: tris[(trifluoromethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Preferred trissulfonyl methanes derived additives also include salts of DBN (1,5-diazabicyclo[4.3.0]non-5-ene) with the following trissulfonyl methanes: tris[(trifluoromethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. Preferred trissulfonyl methanes derived additives also include salts of TPI (2,4,5-triphenyl-4,5-dihydro-1H-imidazole) with the following trissulfonyl methanes: tris[(trifluoromethyl)sulfonyl]methane, and 4-[2-({bis[(trifluoromethyl)sulfonyl]methyl}sulfonyl)-1,1,2,2-tetrafluoroethyl]-2,2,3,3,5,5,6,6-octafluoromorpholine. Preferred trissulfonyl methanes derived additives also include the salt of 2-phenyl-1H-benzimidazole with the following trissulfonyl methane: tris[(trifluoromethyl)sulfonyl]methane. Preferred trissulfonyl methanes derived additives also include the salt of 2,4,4-trimethyl-4,5-dihydro-1,3-oxazole with the following trissulfonyl methane: ,tris[(trifluoromethyl)sulfonyl]methane. Preferred trissulfonyl methanes derived additives also include the salt of 2-methyl-4,5-dihydro-1,3-thiazole with the following trissulfonyl methane: tris[(trifluoromethyl)sulfonyl]methane. Preferred trissulfonyl methanes derived additives also include the salt of 1,3,4,6,7,8-hexahydro-2H-pyrimido[1,2-a]pyrimidine with the following trissulfonyl methane: tris[trifluoromethyl)sulfonyl]methane, Preferred trissulfonyl methanes derived additives also include the salt of 2,3,4,7,8,9-hexahydro-6H-pyrido[1,2-a]pyrimidin-6-one with the following trissulfonyl methane: tris[(trifluoromethyl)sulfonyl]methane. Preferred trissulfonyl methanes derived additives also include the salt of 1,1,2,3,3-pentamethylguanidine with the following trissulfonyl methane: tris[(trifluoromethyl)sulfonyl]methane.

More preferred trissulfonyl methanes derived additives include salts of DBU (1,8-diazabicyclo[5.4.0]undec-7-ene) with the following trissulfonyl methanes: tris[(trifluoromethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. More preferred trissulfonyl methanes derived additives also include salts of DBN (1,5-diazabicyclo[4.3.0]non-5-ene) with the following trissulfonyl methanes: tris[(trifluoromethyl)sulfonyl]methane, 4,4,5,5-tetrafluoro-1,1,3,3-tetraoxido-1,3-dithiolan-2-yl trifluoromethyl sulfone, and 4-[2-({bis[(trifluoromethyl)sulfonyl]methyl}sulfonyl)-1,1,2,2-tetrafluoroethyl]-2,2,3,3,5,5,6,6-octafluoromorpholine. More preferred trissulfonyl methanes derived additives also include salts of TPI (2,4,5-triphenyl-4,5-dihydro-1H-imidazole) with the following trissulfonyl methanes: tris[(trifluoromethyl)sulfonyl]methane, and 4-[2-({bis[(trifluoromethyl)sulfonyl]methyl}sulfonyl)-1,1,2,2-tetrafluoroethyl]-2,2,3,3,5,5,6,6-octafluoromorpholine. More preferred trissulfonyl methanes derived additives also include the salt of 2-phenyl-1H-benzimidazole with the following trissulfonyl methane: tris[(trifluoromethyl)sulfonyl]methane. More preferred trissulfonyl methanes derived additives also include the salt of 1,3,4,6,7,8-hexahydro-2H-pyrimido[1,2-a]pyrimidine with the following trissulfonyl methane: tris[(trifluoromethyl)sulfonyl]methane. More preferred trissulfonyl methanes derived additives also include the salt of 1,1,2,3,3-pentamethylguanidine with the following trissulfonyl methane: tris[(trifluoromethyl)sulfonyl]methane Suitable examples of the additive include, but are not limited to salts of DBU (1,8-diazabicyclo[5.4.0]undec-7-ene) with the following bis sulfonylimides; bis(trifluoromethylsulfonyl)amine, bis(pentafluoroethylsulfonyl)amine, 4,4,5-tetrafluoro-1,1,3,3-tetraoxido-1,3-dithiolan-2-yl trifluoromethyl sulfone, and 1,1,2,2,3,3-hexafluoro-3-[(4- methylpiperazin-1-yl)sulfonyl]-N-[(trifluoromethyl) sulfonyl]propane-1-sulfonamide. Additional suitable examples include salts of DBN (1,5-diazabicyclo[4.3.0] Thon-5-ene) with the following bis sulfonylimides: bis(trifluoromethylsulfonyl)amine, bis(pentafluoroethylsulfonyl) amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-y)sulfonyl]-N-[(trifluoromethyl) sulfonyl]propane-1-sulfonamide. Additional suitable examples include salts of TPI (2,4,5-triphenyl-4,5-dihydro-1H-imidazole) with the following bis sulfonylimides: bis(trifluoromethylsulfonyl)amine, bis(pentafluoroethylsulfonyl) amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. Additional suitable examples include salts of 2-phenyl-1H-benzimidazole with the following bis sulfonylimides: bis(trifluoromethylsulfonyl)amine, bis(pentafluoroethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. Additional suitable examples include salts of 2,4,4-trimethyl-4,5-dihydro-1,3-oxazole with the following bis sulfonylimides: bis(trifluoromethylsulfony)amine, bis(pentafluoroethylsulfonyl) amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. Additional suitable examples include salts of 2-methyl-4,5-dihydro-1,3-thiazole with the following bis sulfonylimides: bis(trifluoromethylsulfonyl)amine, bis(pentafluoroethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. Additional suitable examples include salts of 1,3,4,6,7,8-hexahydro-2H-pyrimido[1,2-a]pyrimidine with the following bis sulfonylimides: bis(trifluoromethylsulfonyl)amine, bis(pentafluoroethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide. Additional suitable examples include salts of 2,3,4,7,8,9-hexahydro-6H-pyrido[1,2-a]pyrimidin-6-one with the following bis sulfonylimides: bis(trifluoromethylsulfonyl) amine, bis(pentafluoroethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide. Additional suitable examples include salts of 1,1,2,3,3-pentamethylguanidine with the following B is sulfonylimides: bis(trifluoromethylsulfonyl) amine, bis(pentafluoroethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide.

Preferred bissulfonylimide derived additives include salts of DBU (1,8-diazabicyclo[5.4.0]undec-7-ene) with the following bis sulfonylimides; bis(trifluoromethylsulfonyl) amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. Preferred bis sulfonylimide derived additives also include salts of DBN (1,5-diazabicyclo[4.3.0]non-5-ene) with the following bis sulfonylimides: bis(trifluoromethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide. Preferred bis sulfonylimide derived additives also include salts of TPI (2,4,5-triphenyl-4,5-dihydro-1H-imidazole) with the following bis sulfonylimides: bis(trifluoromethylsulfonyl)amine, ,4,4,5,5-tetrafluoro-1,1,3,3-tetraoxido-1,3-dithiolan-2-yl trifluoromethyl sulfone, and 1,1, 2,2,3,3-hexafluoro-3-[(4-methylpiperazin-1-yl)sulfonyl]-N-[(trifluoromethyl)sulfonyl]propane-1-sulfonamide.

Preferred bis sulfonylimide derived additives also include the salt of 2-phenyl-1H-benzimidazole with the following bis sulfonylimide: bis(trifluoromethylsulfonyl)amine. Additional suitable examples include the salt of 1,3,4,6,7,8-hexahydro-2H-pyrimido[1,2-a]pyrimidine with the following bis sulfonylimide: bis(trifluoromethylsulfonyl)amine. Additional suitable examples include the salt of 2,3,4,7,8,9-hexahydro-6H-pyrido[1,2-a]pyrimidin-6-one with the following bis sulfonylimide: bis(trifluoromethylsulfonyl) amine. Additional suitable examples include salts of 1,1,2,3, 3-pentamethylguanidine with the following bis sulfonylimides: bis(trifluoromethylsulfonyl)amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide.

More preferred bis sulfonylimide derived additives include salts of DBU (1,8-diazabicyclo[5.4.0]undec-7-ene) with the following bis sulfonylimides; bis(trifluoromethylsulfonyl) amine, 4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl) sulfonyl]propane-1-sulfonamide. More preferred bis sulfonylimide derived additives also include salts of DBN (1,5-diazabicyclo[4.3.0]non-5-ene) with the following bis sulfonylimides: bis(trifluoromethylsulfonyl)amine, 4,4,5, 5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide. More preferred bis sulfonylimide acid derived additives also include salts of TPI (2,4,5-triphenyl-4,5-dihydro-1H-imidazole) with the following bis sulfonylimides: bis(trifluoromethylsulfonyl)amine, ,4,4,5,5-tetrafluoro-1,1,3,3-tetraoxido-1,3-dithiolan-2-yl trifluoromethyl sulfone, and 1,1,2,2,3,3-hexafluoro-3-[(4-methylpiperazin-1-yl)sulfonyl]-N-[(trifluoromethyl)sulfonyl]propane-1-sulfonamide. More preferred bis sulfonylimide acid derived additives also include the salt of 2-phenyl-1H-benzimidazole with the following bis sulfonylimide: bis(trifluoromethylsulfonyl)amine. More preferred bis sulfonylimide acid derived additives also include the salt of 1,3,4,6,7,8-hexahydro-2H-pyrimido[1,2-a]pyrimidine with the following bis sulfonylimide: bis(trifluoromethylsulfonyl) amine.

Suitable examples of the additive include, but are not limited to salts of DBU (1,8-diazabicyclo[5.4.0]undec-7-ene) with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of DBN (1,5-diazabicyclo[4.3.0]non-5-ene) with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl) sulfamic acid. Additional suitable examples include salts of TPI (2,4,5-triphenyl-4,5-dihydro-1H-imidazole) with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl) sulfamic acid. Additional suitable examples include salts of 2-phenyl-1H-benzimidazole with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of 2,4,4-trimethyl-4,5-dihydro-1,3-oxazole with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of 2-methyl-4,5-dihydro-1,3-thiazole with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of 1,3,4,6,7,8-hexahydro-2H-pyrimido[1,2-a]pyrimidine with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of 2,3,4,7,8,9-hexahydro-6H-pyrido[1,2-a]pyrimidin-6-one with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid. Additional suitable examples include salts of 1,1,2,3,3-pentamethylguanidine with the following sulfamic acids: trifluoromethsulfamic acid, cyclohexylsulfamic acid, dicyclohexylsulfamic acid, benzylsulfamic acid, and (2,2,3,3,4,4,5,5,6,6-decafluorocyclohexyl)sulfamic acid.

Preferred sulfamic acid derived additives include salts of DBU (1,8-diazabicyclo[5.4.0]undec-7-ene) with the following sulfamic acids: cyclohexylsulfamic acid, dicyclohexylsulfamic acid, benzylsulfamic acid, and (2,2,3,3,4,4,5,5,6,6-decafluorocyclohexyl)sulfamic acid. Preferred sulfamic acid derived additives also include salts of DBN (1,5-diazabicyclo[4.3.0]non-5-ene) with the following sulfamic acids: cyclohexylsulfamic acid, dicyclohexylsulfamic acid, and benzylsulfamic acid. Preferred sulfamic acid derived additives also include the salt of TPI (2,4,5-triphenyl-4,5-dihydro-1H-imidazole) with the following sulfamic acid: trifluoromethsulfamic acid. Preferred sulfamic acid derived additives also include the salt of 2-phenyl-1H-benzimidazole with the following sulfamic acid: trifluoromethsulfamic acid. Preferred sulfamic acid derived additives also include the salt of 1,3,4,6,7,8-hexahydro-2H-pyrimido[1,2-a]pyrimidine with the following sulfamic acid : cyclohexylsulfamic acid. Preferred sulfamic acid derived additives also include the salt of 1,1,2,3,3-pentamethylguanidine with the following sulfamic acid: cyclohexylsulfamic acid More preferred sulfamic acid derived additives include salts of DBU (1,8-diazabicyclo[5.4.0]undec-7-ene) with the following sulfamic acids: cyclohexylsulfamic acid, dicyclohexylsulfamic acid, and benzylsulfamic acid. More preferred sulfamic acid derived additives also include salts of DBN (1,5-diazabicyclo[4.3.0]non-5-ene) with the following sulfamic acids: cyclohexylsulfamic acid, dicyclohexylsulfamic acid, and benzylsulfamic acid. More preferred sulfamic acid derived additives also include the salt of TPI (2,4,5-triphenyl-4,5-dihydro-1H-imidazole) with the following sulfamic acid: trifluoromethsulfamic acid.

Suitable examples of the additive include, but are not limited to salts of DBU (1,8-diazabicyclo[5.4.0]undec-7-ene) with the following hydrogen sulfates: methyl hydrogen sulfate, phenyl hydrogen sulfate, and benzyl hydrogen sulfate. Additional suitable examples include salts of DBN (1,5-diazabicyclo[4.3.0]non-5-ene) with the following hydrogen sulfates: methyl hydrogen sulfate, phenyl hydrogen sulfate, and benzyl hydrogen sulfate. Additional suitable examples include salts of TPI (2,4,5-triphenyl-4,5-dihydro-1H-imidazole) with the following hydrogen sulfates methyl hydrogen sulfate, phenyl hydrogen sulfate, and benzyl hydrogen sulfate. Additional suitable examples include salts of 2-phenyl-1H-benzimidazole with the following hydrogen sulfates: methyl hydrogen sulfate, phenyl hydrogen sulfate, and benzyl hydrogen sulfate. Additional suitable examples include salts of 2,4,4-trimethyl-4,5-dihydro-1,3-oxazole with the following hydrogen sulfates: methyl hydrogen sulfate, phenyl hydrogen sulfate, and benzyl hydrogen sulfate. Additional suitable examples include salts of 2-methyl-4,5-dihydro-1,3-thiazole with the following hydrogen sulfates: methyl hydrogen sulfate, phenyl hydrogen sulfate, and benzyl hydrogen sulfate. Additional suitable examples include salts of 1,3,4,6,7,8-hexahydro-2H-pyrimido[1,2-a]pyrimidine with the following hydrogen sulfates: methyl hydrogen sulfate, phenyl hydrogen sulfate, and benzyl hydrogen sulfate. Additional suitable examples include salts of 2,3,4,7,8,9-hexahydro-6H-pyrido[1,2-a]pyrimidin-6-one with the following hydrogen sulfates: methyl hydrogen sulfate, phenyl hydrogen sulfate, and benzyl hydrogen sulfate. Additional suitable examples include salts of 1,1,2,3,3-pentamethylguanidine with the following hydrogen sulfates: methyl hydrogen sulfate, phenyl hydrogen sulfate, and benzyl hydrogen sulfate.

Preferred hydrogen sulfate derived additives include salts of DBU (1,8-diazabicyclo[5.4.0]undec-7-ene) with the following hydrogen sulfates: methyl hydrogen sulfate, and phenyl hydrogen sulfate. Preferred hydrogen sulfate derived additives also include salts of DBN (1,5-diazabicyclo[4.3.0]non-5-ene) with the following hydrogen sulfates: methyl hydrogen sulfate, phenyl hydrogen sulfate, and benzyl hydrogen sulfate. Preferred hydrogen sulfate derived additives also include salts of TPI (2,4,5-triphenyl-4,5-dihydro-1H-imidazole) with the following hydrogen sulfates methyl hydrogen sulfate, and phenyl hydrogen sulfate. Preferred hydrogen sulfate derived additives also include salts of 1,1,2,3,3-pentamethylguanidine with the following hydrogen sulfates: methyl hydrogen sulfate and phenyl hydrogen sulfate.

More preferred hydrogen sulfate derived additives include salts of DBU (1,8-diazabicyclo[5.4.0]undec-7-ene) with the following hydrogen sulfates: methyl hydrogen sulfate, and phenyl hydrogen sulfate. More preferred hydrogen sulfate derived additives also include salts of DBN (1,5-diazabicyclo[4.3.0]non-5-ene) with the following hydrogen sulfates: methyl hydrogen sulfate, and phenyl hydrogen sulfate. More preferred hydrogen sulfate derived additives also include the salt of TPI (2,4,5-triphenyl-4,5-dihydro-1H-imidazole) with the following hydrogen sulfate: methyl hydrogen sulfate.

The concentration of the salt in the photoresist composition may range from about 0.01% to about 5 wt % of the non solvent portion of the photoresist composition. A preferred concentration of the salt is from about 0.02% to about 2.5% of the non-solvent portion of the photoresist composition. A more preferred concentration of the salt is from about 0.03% to about 2.0% of the non-solvent portion of the photoresist composition. A most preferred concentration of the salt is from about 0.05% to about 1.25% of the non-solvent portion of the photoresist composition.

In one embodiment, the ionic non-photosensitive additive in the photoresist composition is a compound of Structure $I_0$ ($B^+A_0^-$) wherein the acid generated upon photoactivation and $A_0^-H^+$ differ in pKa values by at least about 0.5. Advantages seen with the combination include improvements in profile, depth of focus, exposure latitude, particularly on reflective surfaces, which minimizes the necessity for employing an antireflective layer. Preferred salt cations for this embodiment are iminium cations resulting from neutralization of a strong base. Examples of such strong bases include, but are not limited to DBU and DBN. Examples of the acid combinations for $A_0^-$ $H^+$ and the photoacid include, but are not limited to tris sulfonyl methides with sulfonic acids, and bissulfonylimides with sulfonic acids.

In one embodiment, the basicity ($pK_b$) of the (optional) quencher in the photoresist composition and the conjugate base of the salt cation used to form the iminium salt differ in $pK_b$ values by at least about 0.5. The combination of quencher and salt can be employed to fine tune the diffusivity of photogenerated or other acid, particularly in the lower exposures areas around the edges of features to improve line edge roughness.

Combinations of quencher and salt in which the quencher is a strong base and the conjugate base of the salt cation is a weaker base or in which the quencher is a weak base and the conjugate acid of the salt cation is a stronger base are preferred. Examples such combinations include, but are not limited to, TPI with the DBN salt of a sulfonic acid (e.g. p-toluene sulfonic acid), and DBN with the TPI salt of a sulfonic acid (e.g. p-toluene sulfonic acid).

In one embodiment, the ionic non-photosensitive additive in the photoresist composition is a compound of Structure $I_0$ ($B^+A_0^-$) and increases the shelf life of resists comprising easily hydrolysable functional groups.

It is known that maleic polymers are sensitive to base catalyzed hydrolysis in presence of trace amount of $H_2O$ in the formulation resulting in opening of maleic anhydride ring and generation of carboxylic (maleic) acid. Lactone groups can also ring open to carbon/late groups. The increase of carboxylic acid bounded to the polymer in the formulation during the time of storage has a negative impact on functional performance of the resist. The shift of photospeed, footing, rounding of profiles, decrease of resolution, exposure latitude and increased unexposed thickness loss are commonly observed issues.

The iminium salt appears to act in the photoresist as an acid diffusion control agent, yet not catalyze the hydrolysis of the anhydride or lactone groups in the polymer.

It is preferred that the iminium salt employed in photoresist formulations containing resins with anhydride groups or lactone groups have a anion of a relatively weak acid that is, in general, not strong enough to efficiently remove the protecting group on the polymer or is relatively weak but also bulky. Examples of such acids are carboxylic acids and bulky, weaker sulfonic acids such as camphorsulfonic acid. Preferred iminium salt cations are those of weaker bases such as triphenylimidazole (TPI).

If a quencher is also used in the photoresist, it is preferred that the quencher be a relatively weak base.

The resin binder of the present invention is preferably a poorly alkali soluble or alkali insoluble binder comprising one or more blocked (masked) alkali solubilizing groups (acid sensitive groups). The functionality blocking some or all of the alkali solubilizing groups is acid sensitive. The presence of an acid catalyzes the deblocking of the alkali solubilizing group and renders the polymer alkali soluble. Suitable alkali solubilizing groups include, but are not limited to, carboxylic acids, sulfonic acid, phenols, acidic alcohols, hydroxyimides, hydroxymethylimides, and silanols. Suitable acidic hydroxyl, carboxyl and sulfamido groups are further described in U.S. Patent Appl. 2006/0110677. Examples of monomeric units containing alkali soluble monomeric units after deblocking include, but are not limited to,

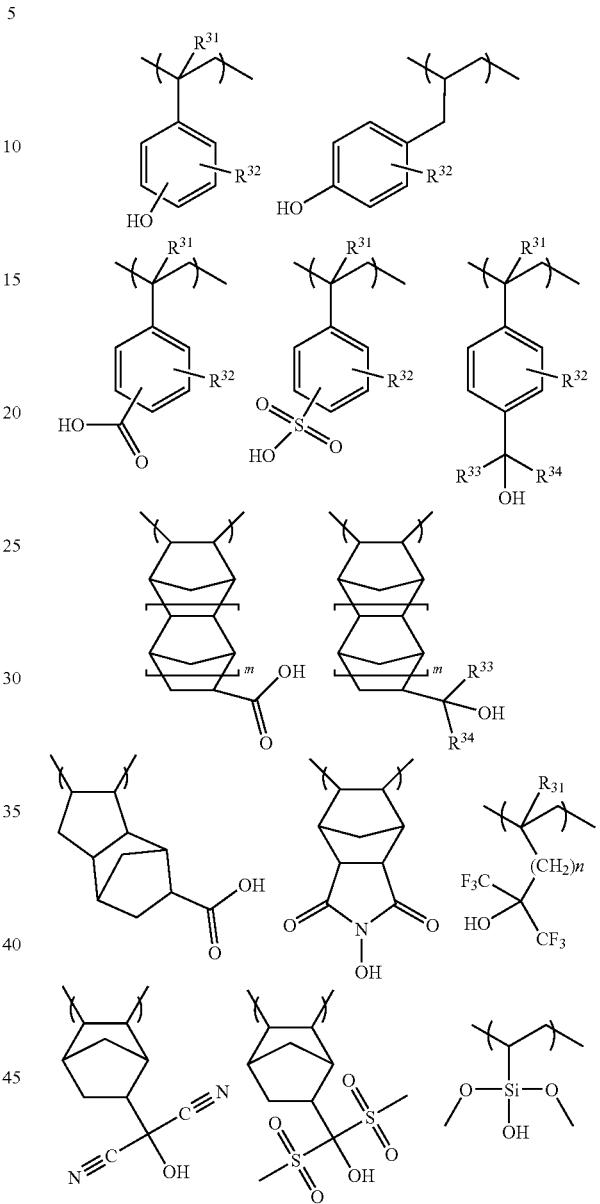

wherein $R^{31}$ is independently a hydrogen atom, a $C_1$-$C_3$ alkyl group, or a $C_1$-$C_3$ perfluorinated alkyl group; $R^{32}$, $R^{33}$ and $R^{34}$ are independently a hydrogen atom or a $C_1$-$C_6$ alkyl group, or a $C_1$-$C_3$ perfluorinated alkyl group. Examples of preferred $R^{31}$ groups include, but are not limited to, hydrogen, methyl or trifluoromethyl. The preferred examples of $R^{32}$, $R^{33}$ and $R^{34}$ include, but are not limited to hydrogen, methyl, ethyl, propyl, trifluoromethyl or cyclohexyl.

Any number of acid-sensitive protecting groups, known to those skilled in the art, may be employed. Preferred acid-sensitive protecting groups include tertiary alkyl groups, α-alkoxy alkyl groups, arylisopropyl and alicyclic substituted isopropyl groups. Specific acid-sensitive protecting groups include, but are not limited to, t-butyl, 1,1-dimethyl-propyl, 1-methyl-1-cyclohexyl, 2-isopropyl-2-adamantyl, tetrahydropyran-2-yl, methoxy methyl, ethoxy ethyl and the like. Examples of suitable blocked alkali solubilizing groups include, but are not limited to, tertiary alkyl esters such as t-butyl esters, alpha alkoxy esters, t-butoxyphenyl, t-butoxyimido, t-butoxycarbonyloxy, and t-butoxymethylimido. Examples of blocked alkali solubilizing groups can be found in U.S. Pat. Nos. 5,468,589, 4,491,628, 5,679,495, 6,379,861, 6,329,125, 6,440,636, 6,830867, 6,136,501 and 5,206,317 and U.S. Pat. Appl. Nos. 2007/0077519 and 2008/0081289, which are incorporated herein by references.

Examples of suitable monomers containing blocked alkali solubilizing groups include, but are not limited to, t-butyl methacrylate, t-butyl acrylate, and monomers represented by the structures below:

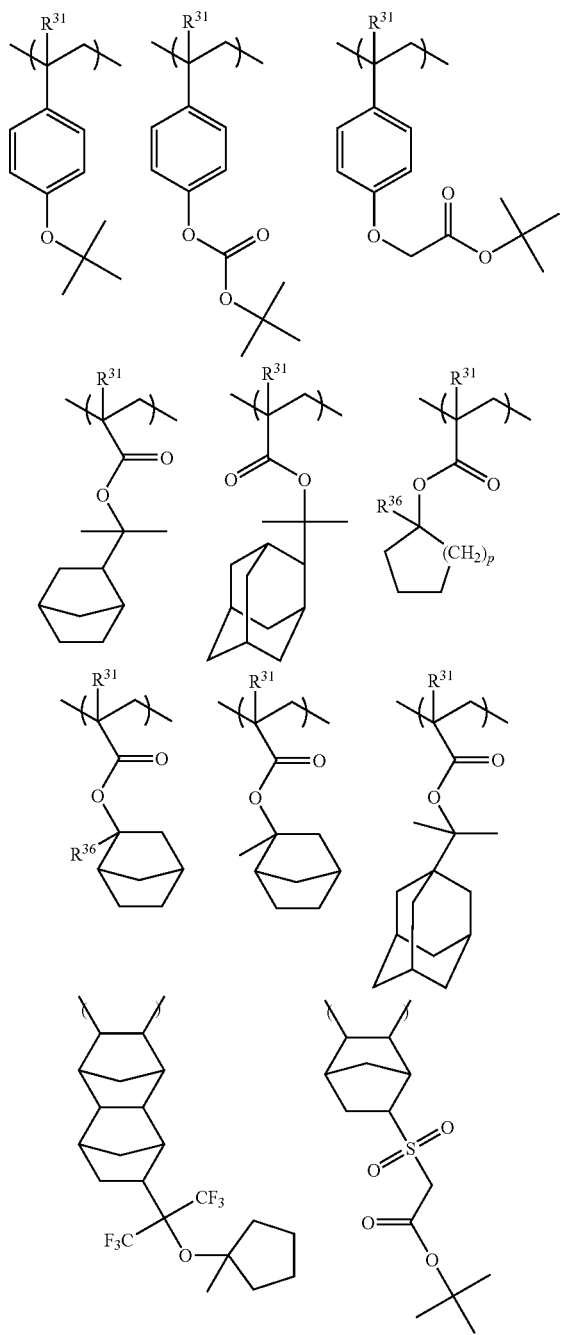

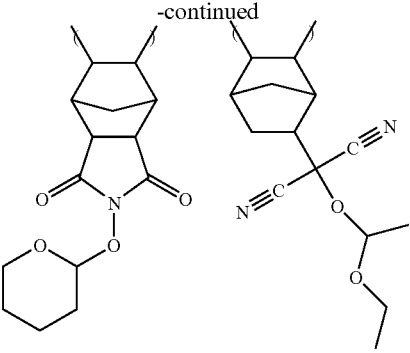

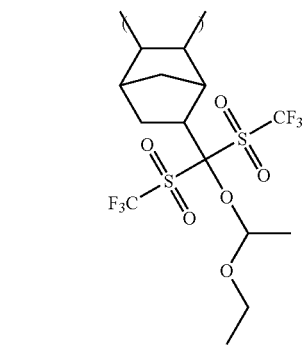

wherein $R^{31}$ is same as described above and $R^{35}$ is an $C_1$-$C_6$ alkyl group or $C_5$-$C_7$ cycloalkyl group or $C_6$-$C_{14}$ aromatic groups and $R^{36}$ is an $C_1$-$C_6$ alkyl group or $C_5$-$C_7$ cycloalkyl group.

The resin binder may further comprise one or more monomeric units comprising one or more silicon moieties. Suitable examples of silicon monomeric unit are disclosed, for example, in U.S. Pat. Nos. 6,165,682, 6,916,543 and 6,929,897 which are incorporated herein by references.

In addition the polymer may optionally comprise one or more property enhancing co-monomeric units for the purpose of optimizing functional characteristics of the final polymer, such as incorporating polar groups to promote solubility of the polymer in the casting solvent, balancing the polymer's optical parameters to improve lithographic behavior or optimizing the polymer's etch selectivity. Alkali solubilizing monomeric units as described above may be used to change the dissolution characteristics of the polymer. Suitable modifying monomers include radical polymerizable vinyl monomers such as vinyl ethers, vinyl esters, substituted and unsubstituted styrenes and the like. Examples of preferred modifying monomers include, but are not limited to, methyl vinyl ether, ethyl vinyl ether, ethyleneglycol vinyl ether, styrene and tert-butyl styrene. Additional examples of modifying monomers are described below, Additional examples of preferred modifying monomers are monomers resulting in monomeric units of Structure II (unsaturated cyclic anhydrides), or of Structure III (acrylic esters).

II

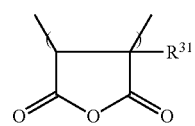

-continued

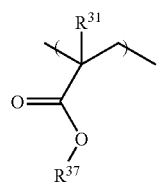

III wherein $R^{31}$ is the same meaning defined above, $R^{37}$ is a $C_1$-$C_{20}$ linear, branched, or cyclic alkyl group, $C_7$-$C_{20}$ alicyclic alkyl group, a $C_1$-$C_{20}$ linear, branched, or cyclic ether group, a $C_3$-$C_8$ lactone group or a $C_6$-$C_{20}$ aromatic group or a $C_7$-$C_{20}$ arylalkyl group.

Examples of monomers having Structure II include, but are not limited to, maleic anhydride or citraconic anhydride.

Examples of suitable $R^{37}$ groups include, but are not limited to, hydrogen, methyl, ethyl, cyclohexyl, cyclopentyl, isobornyl, adamantyl, 3-hydroxy-1-adamantyl, 3,5-dihydroxy-1-adamantyl, tetrahydrofuranyl, tetrahydrofuran-2-ylmethyl, 2-oxotetrahydrofuran-3-yl, 5-oxotetrahydrofuran-3-yl, 5-oxo-4-oxatricyclo[4.2.1.0$^{3,7}$]non--9-yl, 6-hydroxy norbornyl, decahydronaphthyl, phenyl, benzyl, phenylethyl, cyclohexylphenyl, biphenyl or naphthyl groups. Preferred examples of $R^{37}$ are methyl, ethyl, cyclohexyl, adamantyl, tetrahydrofuranyl, benzyl, biphenyl, cyclohexylphenyl or naphthyl groups. Examples of suitable monomers yielding monomeric units of Structure III include, but are not limited to, methyl methacrylate, adamantyl methacrylate, cyclohexyl methacrylate, hydroxyethyl methacrylate, phenyl acrylate, benzyl methacrylate, benzyl acrylate, biphenyl acrylate, biphenyl methacrylate, cyclohexylphenyl methacrylate, methyl trifluoromethylacrylate or naphthyl methacrylate.

The resin binder may further comprise one or more monomeric units comprising one or more silicon moieties. Suitable examples of silicon monomeric unit are disclosed, for example, in U.S. Pat. Nos. 6,165,682, 6,916,543 and 6,929,897 which are incorporated herein by reference. Two or more species of resin (B) may be use in combination. Specific examples of combinations of suitable repeating units in the main chain resin (B) are set forth below but the present invention is not limited thereto.

B-1

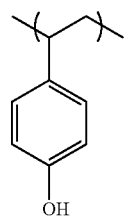

B-2

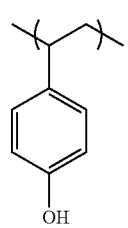

B-3

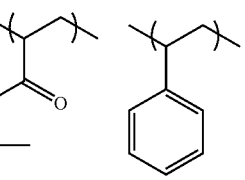

B-4

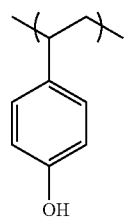

B-5

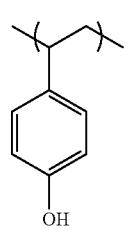

B-6

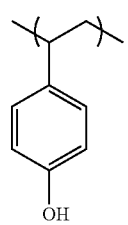

B-7

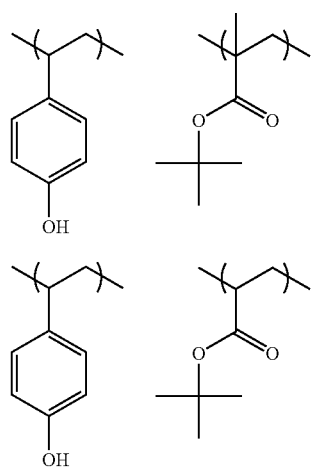

B-8

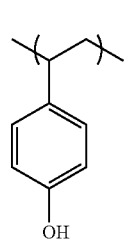 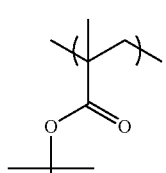 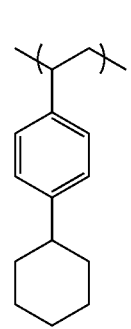

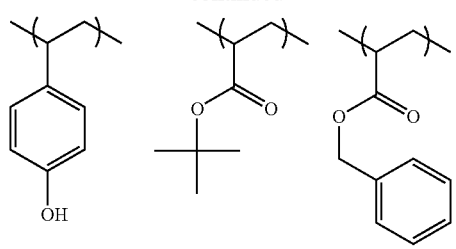
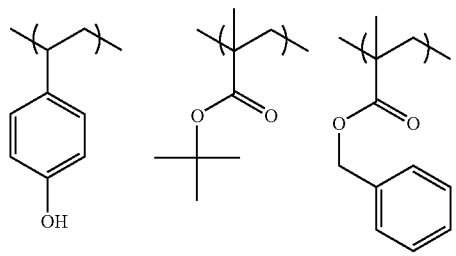
B-9
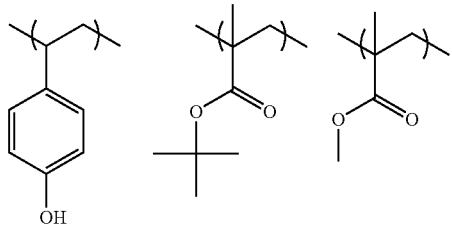
B-10
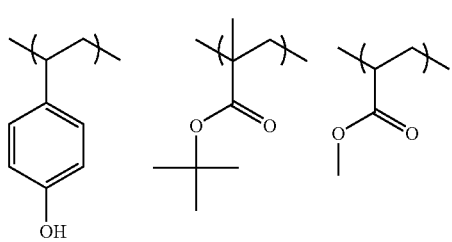
B-11
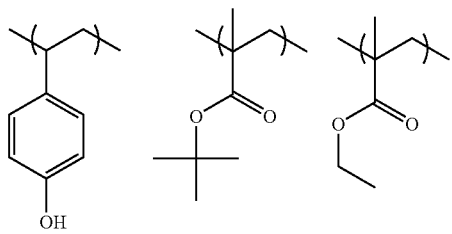
B-12
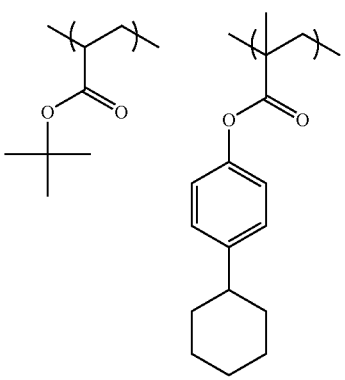
B-13
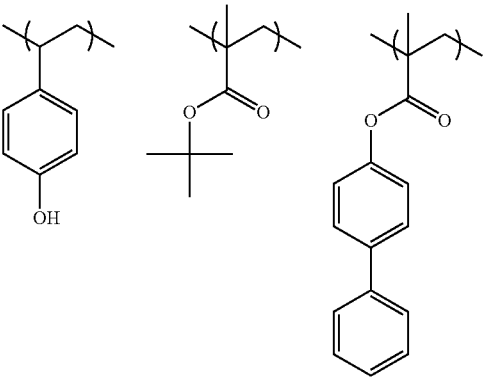
B-14
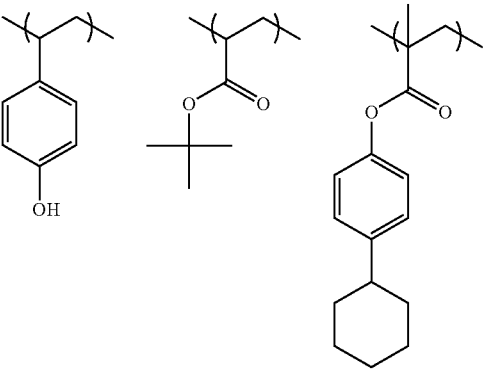
B-15
B-16

B-17
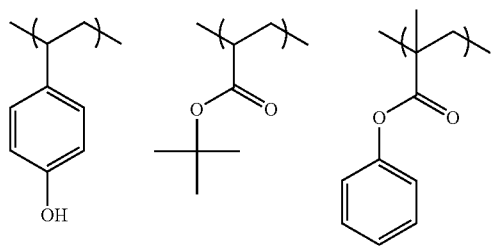
B-18
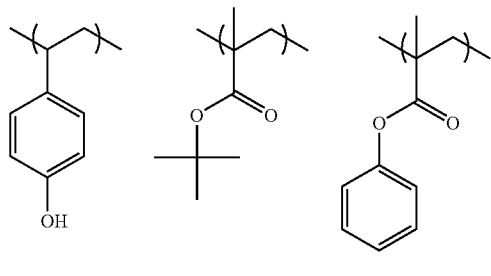
B-19
B-20
B-21
B-22
B-23
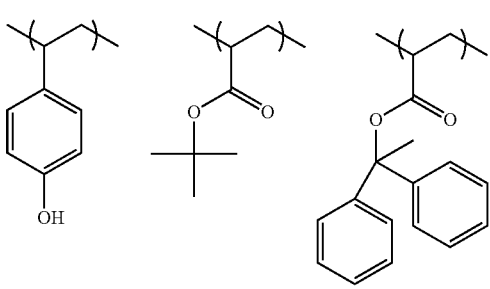
B-24
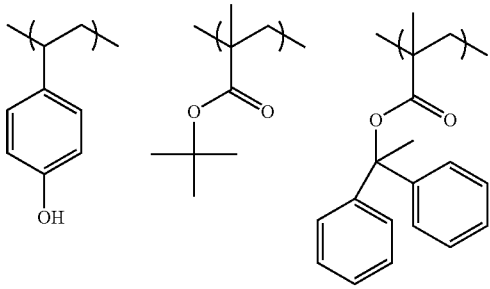
B-25
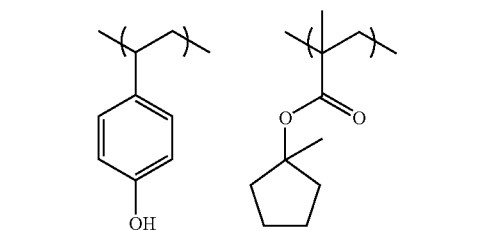
B-26
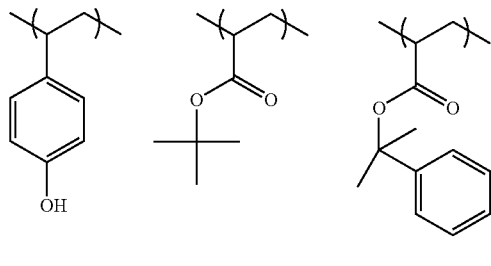
B-27
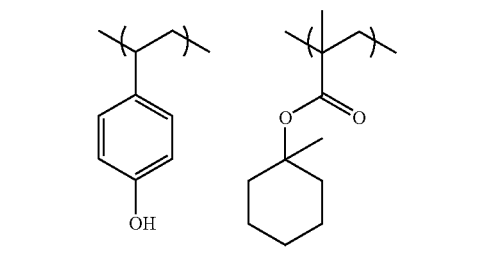
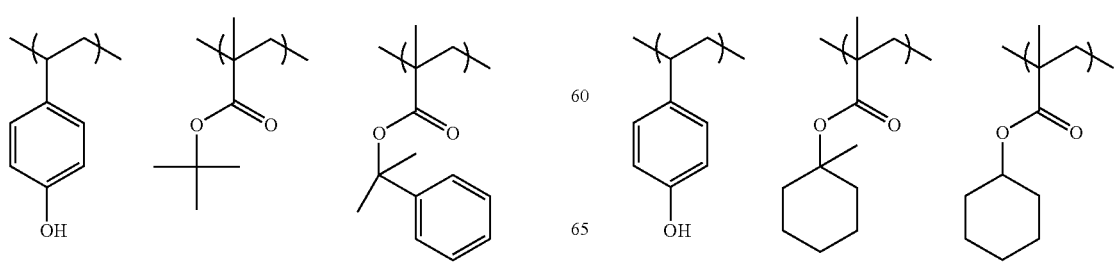

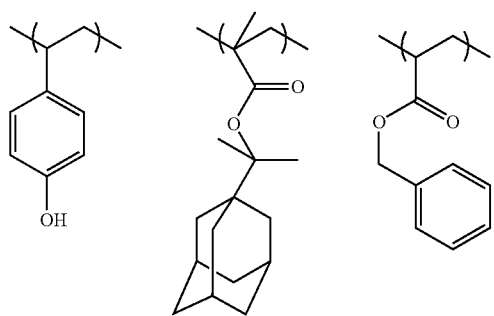
B-28
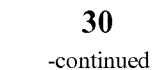
B-32
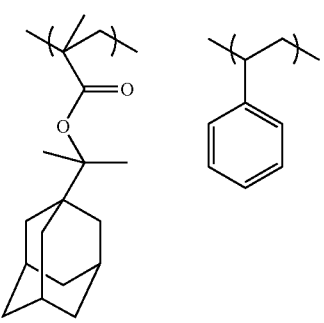
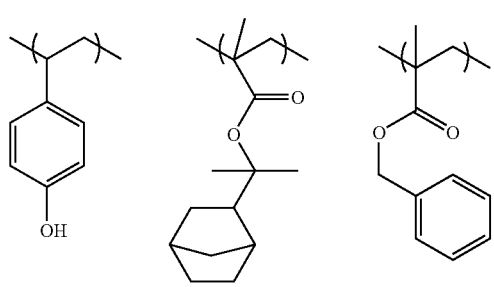
B-29
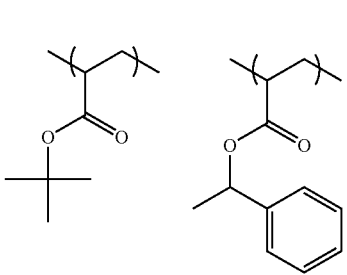
B-33
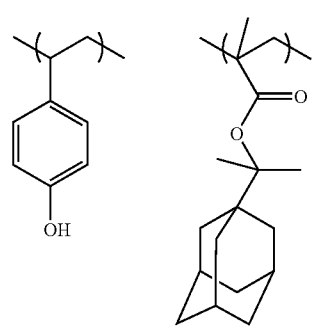
B-30
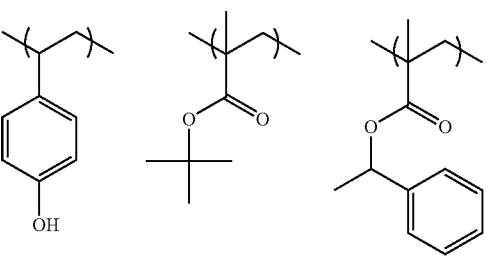
B-34
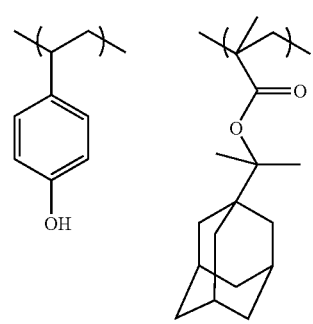
B-31
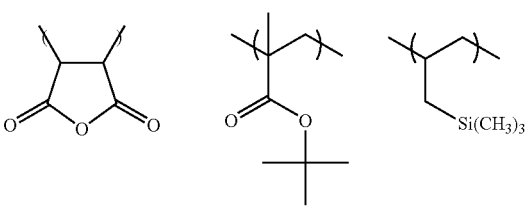
B-35
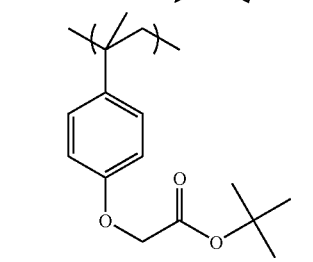
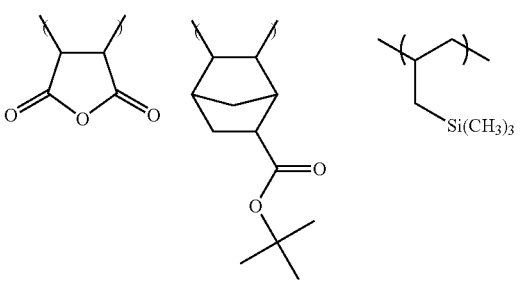
B-36

B-37
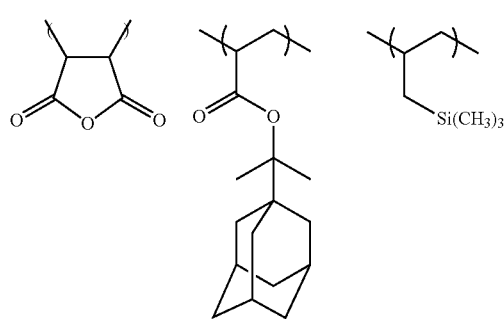
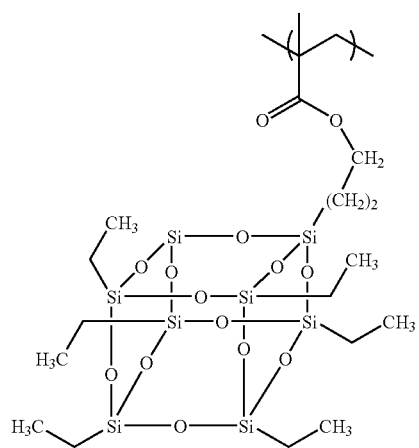
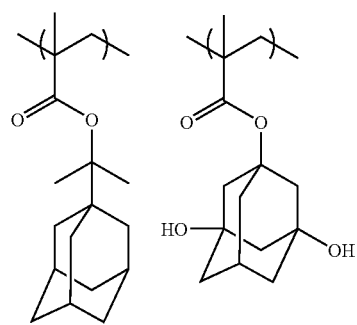
B-38
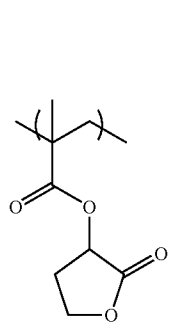
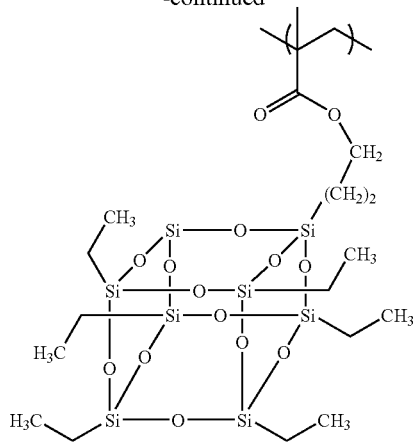
B-39
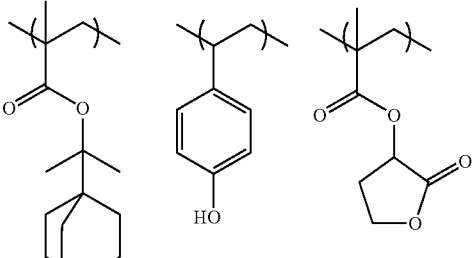
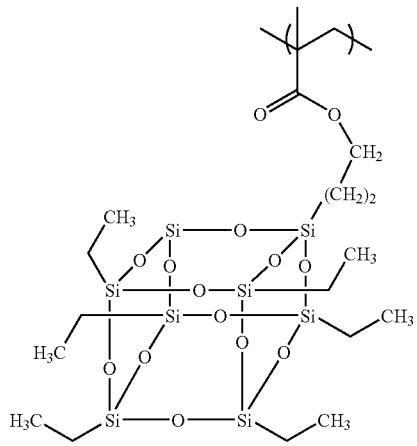
B-40
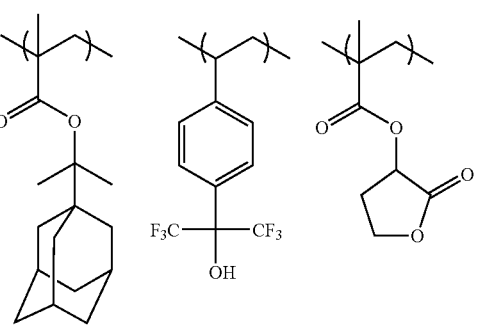

-continued

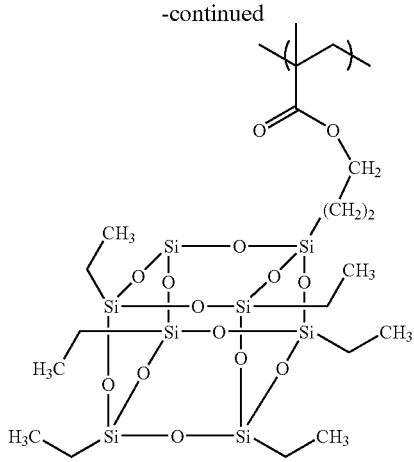

Cycloolefins, with norbornene and tetracyclododecene derivatives, may be polymerized by ring-opening metathesis, free-radical polymerization or using metal organic catalysts. Cycloolefin derivatives may also be copolymerized with maleic anhydride or with maleimide or its derivatives. Such polymers are described in the following references M- J. Bowden et al, J. Photopolym. Sci., & Tech., Vol. 12, No. 3, p423 (1999); C. G. Willson et al, Advances in Resist Technology and Processing, SPIE, Vol. 3333, p425, (1998).

Examples of suitable photoresist polymers can be found in U.S. Pat. Nos. 6,146,793, 6,165,682, 6,340,734, 6,028,154, 6,042,989, 5,882,844, 5,691,396, 5,731,126, 5,985,524, 6,916,543 and 6,929,897, JP Patent NO. 3,736,606. Other suitable polymers are disclosed in U.S. Pat. Nos. 6,531,260 and 6,590,010 which are incorporated herein by reference.

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, methyltetrahydrofuran, 1,4-dioxane, ethers (e.g., diisopropyl ether), alcohol (e.g. methanol, isopropanol, propyleneglycol methyl ether, ethyl lactate) ketones (e.g., methyl ethyl ketone, methyl isobutyl ketone), an ester solvent (e.g., ethyl acetate, propyleneglycol methyl ether acetate), an amide solvent (e.g., dimethylformamide, diethylacetamide) ect. The polymerization is preferably performed by using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 60 mass %, preferably from 10 to 50 mass %, and the reaction temperature is usually from 30 to 150° C., preferably from 40 to 120° C., more preferably from 50 to 100° C.

The weight average molecular weight of the resin as the component (B) is preferably from 2,000 to 100,000 in terms of polystyrene by the GPC method. With a weight average molecular weight of 2,000 or more, heat resistance and dry etching resistance can be increased and with a weight average molecular weight of 100,000 or less, developability can be enhanced and at the same time, by virtue of low viscosity, the film-forming property can be improved. The molecular weight is more preferably from 5,000 to 50,000, still more preferably from 10,000 to 30,000. By adjusting the molecular weight, heat resistance, resolving power, development defect and the like of the composition all can be satisfied. The dispersity (Mw/Mn) of the resin as the component (B) is preferably from 1.0 to 3.0, more preferably from 1.2 to 2.5, still more preferably from 1.2 to 1.6. By adjusting the dispersity to an appropriate range, the line edge roughness performance can be enhanced.

In the resist composition of the present invention, the amount of the resin as the component (B) blended in the entire composition is preferably from 40 to 99.99 mass %, more preferably from 50 to 99 mass %, still more preferably from 80 to 96 mass %, based on the entire solid content.

The photoactive compound capable of generating a strong acid upon exposure to a source of high energy radiation is commonly referred to as a photoacid generator, or PAG. Any suitable photoacid generator may be used in the photosensitive compositions of the present invention. One skilled in the art would be able to choose the appropriate PAG based upon such factors as acidity, catalytic activity, volatility, diffusivity, and solubility. Suitable classes of PAGs generating sulfonic acids include, but are not limited to, sulfonium or iodonium salts, oximidosulfonates, bissulfonyldiazomethanes, and nitrobenzylsulfonate esters. Suitable photoacid generator compounds are disclosed, for example, in U.S. Pat. Nos. 5,558,978, 5,468,589, 6,844,132, 6,855,476, and 6,911,297 which are incorporated herein by reference. Preferred PAGs are tris(perfluoroalkylsulfonyl)methides, tris(perfluoroalkylsulfonyl)imides, and those generating perfluoroalkylsulfonic acids.

Additional examples of suitable photoacid generators for use in this invention include, but are not limited to, triphenylsulfonium perfluorooctanesulfonate, triphenylsulfonium perfluorobutanesulfonate, methylphenyldiphenylsulfonium perfluorooctanesulfonate, 4-n-butoxyphenyldiphenylsulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium, perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Examples of tris(perfluoroalkylsulfonyl)methide and tris(perfluoroalkylsulfonyl)imide PAGs that are suitable for use in the present invention can be found in U.S. Pat. Nos. 5,554,664 and 6,306,555, each of which is incorporated herein in its entirety. Additional examples of PAGs of this type can be found in Proceedings of SPIE, Vol. 4690, pp. 817-828 (2002). Suitable methide and imide PAGs include, but are not limited to, triphenylsulfonium tris(trifluoromethylsulfonyl)methide, methylphenyldiphenylsulfonium tris(perfluoroethylsulfonyl)methide, triphenylsulfonium tris(perfluorobutylsulfonyl)methide, triphenylsulfonium bis(trifluoromethylsulfonyl)imide, triphenylsulfonium bis(perfluoroethylsulfonyl)imide, and triphenylsulfonium bis(perfluorobutylsulfonyl)imide.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

More preferred PAGs are triarylsulfonium perfluoroalkylsulfonates and triarylsulfonium tris(perfluoroalkylsulfonyl)methides. Most preferred PAGs are triphenylsulfonium perfluorooctanesulfonate (TPS-PFOS), triphenylsulfonium perfluorobutanesulfonate (TPS-Nonaflate), methyiphenyldiphenylsulfonium perfluorooctanesulfonate (TDPS-PFOS), tris(-t-butylphenyl)sulfonium perfluorobutanesulfonate (TTBPS-Nonaflate), triphenylsulfonium tris(trifluoromethylsulfonyl)methide (TPS-C1) and methylphenyldiphenylsulfonium tris(perfluoroethylsulfonyl)methide.

The total photoacid generator content of the photosensitive composition is from about 0.05 wt % to about 20 wt % of the total solids content. The preferred range is from about 1 wt % to about 15 wt %. The photoacid generator may be used alone or in combination with one or more photoacid generators. The percentage of each PAG in the photoacid generator mixture is between about 10 wt % to about 90 wt % of the total photoacid generator mixture. Preferred photoacid generator mixtures contain about 2 or 3 photoacid generators. Such mixtures may be of the same class or different classes. Examples of preferred mixtures include sulfonium salts with bissulfonyldiazomethane compounds, sulfonium salts and imidosulfonates, and two sulfonium salts.

The choice of solvent for the photosensitive composition and the concentration thereof depends principally on the type of functionalities incorporated in the acid labile polymer, the photoacid generator, and the coating method. The solvent should be inert, should dissolve all the components in the photosensitive composition, should not undergo any chemical reaction with the components and should be re-removable on drying after coating. Suitable solvents for the photosensitive composition may include alcohol, ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyethanol, 2-ethoxyethyl acetate, propylene glycol monomethyl ether, 1-methoxy-2-propyl acetate, 1,2-dimethoxyethane ethyl acetate, cellosolve acetate, propylene glycol monomethyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. More preferred solvents are propylene glycol monomethyl ether, 2-heptanone, and propylene glycol monomethyl ether acetate, n-butyl acetate, ethyl lactate, cyclohexanone, 2-heptanone. These solvents may be used individually or in combination of two or more to improve coating quality of photoresist composition.

Base additives may also be added to the photosensitive composition as quenchers to act as diffusion control agents. One purpose of the base additive is to scavenge protons present in the photosensitive composition prior to being irradiated by the actinic radiation. The base prevents attack and cleavage of the acid labile groups by the undesirable acids, thereby increasing the performance and stability of the photosensitive composition. In addition, the base can act as a diffusion control agent to prevent the photogenerated acid from migrating too far after exposure and lowering resolution. The percentage of base in the photosensitive composition should be significantly lower than the photoacid generator or otherwise the photosensitivity becomes too low. The preferred range of the base compounds, when present, is from about 3 wt % to about 50 wt % of the photoacid generator compound. Suitable examples of base additives include, but are not limited to, cyclopropylamine, cyclobutylamine, cyclopentylamine, dicyclopentylamine, dicyclopentylmethylamine, dicyclopentylethylamine, cyclohexylamine, dimethylcyclohexylamine, dicyclohexylamine, dicyclohexylmethylamine, dicyclohexylethylamine, dicyclohexylbutylamine, cyclohexyl-t-butylamine, cycloheptylamine, cyclooctylamine, 1-adamantanamine, 1-dimethylaminoadamantane, 1-diethylaminoadamantane, 2-adamantanamine, 2-dimethylaminoadamantane, 2-aminonorbornene, and 3-noradamantanamine, 2-methylimidazole, tetramethyl ammonium hydroxide, tetrabutylammonium hydroxide, triisopropylamine, triocylamine, tridodecylamine, 4-dimethylaminopryidine, 4,4'-diaminodiphenyl ether, 2,4,5-triphenylimidazole, 1,4-diazabicyclo[4.3.0]non-5-ene and 1,5-diazabicyclo[4.3.0]non-5-ene, and 1,8-diazabicyclo[5.4.0]undec-7-ene, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5- methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. More preferred base additives are tridodecylamine, 2,4,5-triphenyl imidazole, 1,5-diazobicyclo[4.3.0]non-5-ene and 1,8-diazobicyclo[5.4.0]undec-7-ene.

The photosensitive composition may optionally comprise one or more dissolution inhibitors (DI). Dissolution inhibitors useful for this invention have been studied and are known to those skilled in the art. These compounds can be monomers or oligomers with a weight average molecular weight of no more than 3000. For example DIs can be aromatic compounds containing acid sensitive carboxylic acid esters, carbonate or hydroxyl groups (SPIE Proc. 920, pg 42 (1988), SPIE Proc. 2724, pg 174 (1996), U.S. Pat. No. 6,962,766), such as naphthalene-2-carboxylic acid tert-butyl ester, t-BOC- bisphenol A, t-BOC-trisphenol, or alicyclic or polycyclic structures with at least one acid sensitive substituent as described in SPIE Proc. 2724. pg 355 (1996), U.S. Pat. Nos. 6,927,009 and 6,962,766, such as cholates and acid sensitive adamantylcarboxylic acid esters. For applications that utilize actinic light below 220 nm non-aromatic dissolution inhibitors are preferred.

If used the dissolution inhibitor is typically present in the amount of about 3 to about 50% and more preferably about 5 to about 40% based on the dry weight of the photosensitive composition.

In addition dyes may be added to the photosensitive composition to increase the absorption of the composition to the actinic radiation wavelength. The dye must not poison the photosensitive composition and must be capable of withstanding the process conditions including any thermal treatments. Examples of suitable dyes are fluorenone derivatives, anthracene derivatives or pyrene derivatives. Other specific dyes that are suitable for these photosensitive compositions are described in U.S. Pat. No. 5,593,812.

The photosensitive composition may further comprise conventional additives such as adhesion promoters and surfactants. One skilled in the art will be able to choose the appropriate desired additive and its concentration.

Another embodiment of this invention is a patterning process for production of relief structures on a substrate that comprises: providing a substrate; coating a photosensitive composition of this description on said substrate; baking the photosensitive composition to provide a photosensitive film on the substrate; exposing the photosensitive film to imaging radiation; developing the photosensitive film making a portion of the underlying substrate visible; and rinsing the coated, exposed and developed substrate;

The substrate may be, for example, semiconductor materials such as a silicon wafer, compound semiconductor (III-V) or (II-VI) wafer, a ceramic, glass or quartz substrate. Said substrates may also contain films or structures used for electronic circuit fabrication such as organic or inorganic dielectrics, copper or other wiring metals. Alternatively the substrate may be previously coated with organic or inorganic antireflective coatings.

The photosensitive composition is applied uniformly onto a substrate by known coating methods. For example, the coatings may be applied by spin-coating, dipping, knife coating, laminating, brushing, spraying, and reverse-roller coating. After the coating operation, the solvent is generally removed by drying. The drying step is typically a heating step called soft bake where the photosensitive composition and substrate are heated to a temperature of about 50° C. to about 150° C. for a few seconds to a few minutes; preferably for about 5 seconds to about 30 minutes depending on the thickness, the heating element and end use of the thus generated photosensitive film.

The photosensitive film thickness is optimized for lithographic performance and the need to provide plasma etch resistance for image transfer or substrate treatment and would generally be from about 50 nm to about 1000 nm. Preferably the photosensitive film has a thickness from about 80 nm to about 500 nm. A more preferred thickness range of the photosensitive film is from about 100 nm to about 250 nm. The preferred photosensitive film thickness is from 110 nm to 170 nm.

The photosensitive compositions are suitable for a number of different uses in the electronics industry. For example, they can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate coated with the photosensitive film is exposed imagewise. The term "imagewise" exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources, which can be used, are all sources that emit radiation to which the photoacid generator is sensitive. Examples include high pressure mercury lamps, KrF excimer lasers, ArF excimer lasers, electron beams and x-rays sources.

The process described above for the production of relief structures preferably includes, as a further process measure, heating of the photosensitive film between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed photosensitive film is typically subjected to temperatures of about 50° C. to about 150° C. for a few seconds to a few minutes. The preferred post exposure bake is from about 80° C. to about 130° C. for about 5 seconds to about 300 seconds.

After imagewise exposure and any heat treatment of the material, the exposed areas of the photosensitive film are removed by dissolution in a developer. The choice of the particular developer depends on the type of photosensitive film produced; in particular on the nature of the polymer resin or the photolysis products generated. The developer can include aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After development, the relief structure may be rinsed with a rinse comprising de-ionized water or comprising de-ionized water containing one or more surfactant and dried by spinning, baking on a hot plate, in an oven, or other suitable means.

Subsequently, the substrate carrying the relief structure is generally subjected to at least one further treatment step, which changes the substrate in areas not covered by the photosensitive film. Typically, this can be implantation of a dopant, deposition of another material on the substrate or an etching of the substrate. This is usually followed by the removal of the photosensitive film from the substrate using a suitable stripping method.

The present invention is further described in detail by the following examples. The examples are presented for illustrative purposes only, and are not intended as a limitation on the scope of the invention.

The present invention is further described in detail by the following examples. The examples are presented for illustrative purposes only, and are not intended as a limitation on the scope of the invention.

General Polymer Synthetic Procedure

Acetoxystyrene (232.66 g), PGMEA (494.93 g), PGME (329.95 g) and V601 initiator (6.61 g) were added to a 2-L Amber glass bottle and stirred to dissolve. The addition pump was primed with this monomer solution. t-Butyl methacrylate (78.45 g), benzyl methacrylate (38.89 g), PGMEA (249.61 g), PGME (166.41 g) and V601 initiator (3.56 g) were added to a 1-L Amber glass bottle and stirred to dissolve. The addition pump was primed with second monomer solution.

In a 3-L three-neck round bottom flask, PGMEA (42.00 g) and PGME (28.00 g) were added. A stirring assembly, a thermocouple and a rubber septum were attached to the flask and the setup was placed in an oil bath at 100° C. The two monomer solution lines were fed through the rubber septum and the pumps were started. The pump for acetoxystyrene monomer solution ($1^{st}$ monomer solution) was set for 3.66 mL/min and methacrylate monomer solution was set for 1.58 mL/min. The addition of acetoxystyrene monomer solution was completed after 5 hours and the addition of methacrylate monomer solution was completed after 6 hours. The oil bath was shut off after 14 hours. The rubber septum was removed from the flask and a short-path distillation apparatus was placed in the open joint. The crude polymer solution was distilled under vacuum at 80° C. for 2 hours until the polymer solution became viscous but before the solution was unable to stir. The viscous solution was dissolved in THF/Methanol (50:50, 40% solids) and then precipitated in methanol (3L). The supernatant liquid was decanted and the solid was redissolved in THF/Methanol (50:50). The solution was precipitated again in methanol and the supernatant liquid was decanted. The solid was again redissolved in THF/Methanol (50:50, 40% solids) for methanolysis. The solution was transferred to a 3-L three-neck round bottom flask with a Dean & Stark condenser, a condenser, a stirring assembly and a thermocouple. Sodium methoxide (4.70 g) and methanol (200 mL) were added to the flask. The flask was heated in an oil bath at 70° C. for 2 hours and the distillate was removed continuously through Dean & Stark condenser. The solution was neutralized with Amberlyst-15 resin and then precipitated in DI water (8 L). The solid (Polymer P-1) was isolated by filtration and dried in an oven under vacuum for 12 h at 60° C. Polymer P-2 was synthesized following the procedure above using Acetoxystyrene (240.4 g) t-Butyl methacrylate (83.7 g) and biphenyl methacrylate (26.00 g).

Similarly, Polymer P-5 was synthesized following the procedure above using Acetoxystyrene (238.7 g), t-Butyl acrylate (75.4 g) and benzyl methacrylate (35.9 g).

Polymers P-6, P-9 and P-11 were commercially obtained. Polymers P-12 and P-13 were synthesized by following U.S. Pat Appl No. 2003022097. P-14 was synthesized similarly by following U.S. Pat. No. 6,803,434. Similarly, P-15, P-16 and P-17 were synthesized by following U.S. Pat. No. 6,916,543. P-18 was synthesized by following U.S. Pat. No. 7,625,690.

TABLE 1

Polymer Analyticals

| Polymer Lot # | Monomers | Composition (by $^{13}$C NMR) | Mw | PDI | Tg (° C.) | % solid in PGMEA |
|---|---|---|---|---|---|---|
| P-1 | Hydroxystyrene | 61 | 18,800 | 1.6 | 155 | |
| | t-Butyl methacrylate | 27 | | | | |
| | Benzyl methacrylate | 12 | | | | |
| P-2 | Hydroxystyrene | 65 | 22,000 | 1.8 | — | 30.13 |
| | t-Butyl methacrylate | 25 | | | | |
| | biphenyl methacrylate | 5 | | | | |
| P-5 | Hydroxystyrene | 66 | 26,700 | 1.6 | 143 | |
| | t-Butyl acrylate | 22 | | | | |
| | Benzyl methacrylate | 12 | | | | |
| P-6 | Hydroxystyrene | 60 | 16,600 | 1.6 | — | 37.11 |
| | t-Butyl methacrylate | 30 | | | | |
| | Benzyl methacrylate | 10 | | | | |
| P-9 | Hydroxystyrene | 69 | 22,400 | 1.7 | — | 35.75 |
| | t-Butyl methacrylate | 21 | | | | |
| | Benzyl methacrylate | 10 | | | | |
| P-10 | Hydroxystyrene | 65 | 24,700 | 1.8 | — | 41.91 |
| | t-Butyl methacrylate | 25 | | | | |
| | Benzyl methacrylate | 10 | | | | |
| P-11 | Hydroxystyrene | 65.5 | 18,900 | 1.7 | — | |
| | t-Butyl methacrylate | 25 | | | | |
| | biphenyl methacrylate | 10.5 | | | | |
| P-12 | Hydroxystyrene | 61 | 18,800 | — | — | |
| | t-Butyl acrylate | 26 | | | | |
| | Isobornyl acrylate | 13 | | | | |
| P-13 | Hydroxystyrene | 58 | 12,475 | — | | |
| | t-Butyl acrylate | 19 | | | | |
| | Phenethyl acrylate | 23 | | | | |

TABLE 1-continued

Polymer Analyticals

| Polymer Lot # | Monomers | Composition (by $^{13}$C NMR) | Mw | PDI | Tg (°C.) | % solid in PGMEA |
|---|---|---|---|---|---|---|
| P-14 | Maleic anhydride | 34 | 17,000 | 2.7 | — | 38.4 |
|  | allytrimethylsilane | 30 |  |  |  |  |
|  | t-Butyl acrylate | 26 |  |  |  |  |
|  | Methyl acrylate | 10 |  |  |  |  |
| P-15 | Maleic anhydride | 40 | 10,069 | 2.15 |  | 24.6 |
|  | allytrimethylsilane | 29 |  |  |  |  |
|  | t-Butyl acrylate | 27 |  |  |  |  |
|  | methacrylEthyl-POSS | 4 |  |  |  |  |
| P-16 | X-AdMA | 30 | 14,347 | 2.13 | 120 |  |
|  | DHMA | 24 |  |  |  |  |
|  | 2-methacryloxy-γ-butyrolactone | 32 |  |  |  |  |
|  | methacrylEthyl-POSS | 14 |  |  |  |  |
| P-17 | X-AdMA | 29 | 20,711 | 2.14 | — |  |
|  | Hydroxystyrene | 5 |  |  |  |  |
|  | 2-methacryloxy-γ-butyrolactone | 52 |  |  |  |  |
|  | methacrylEthyl-POSS | 14 |  |  |  |  |
| P-18 | Hydroxystyrene | 65 | 10,500 | 1.65 | — |  |
|  | styrene | 15 |  |  |  |  |
|  | 1-phenylethyl methacrylate | 20 |  |  |  |  |

[(1-methyl-1-tricyclo[3.3.1.1$^{3,7}$]dec-1-yl) ethyl methacrylate (X-AdMA) (3,5-dihydroxytricyclo[3.3.1.1$^{3,7}$] dec-1-yl) methacrylate (DHMA) 3-(3,5,7,9,11,13,15-heptaethylpentacyclo [9.5.1.1$^{3,9}$1$^{5,15}$.1$^{7,13}$]octa-siloxan-1-yl) propyl methacrylate (methacrylEthyl-POSS)

TABLE 2

Photo acid generator

| Code | Name | Commercial name/Description | % solids in PGMEA solution |
|---|---|---|---|
| PAG1 | TPS-C1 | Triphenyl Sulfonium tris[(trifluoromethyl)sulfonyl]methide | 5 |
| PAG 2 | PM 6250 | Triphenyl Sulfonium 1,1,2,2,3,3-hexafluoro-3-(piperidin-1-ylsulfonyl)propane-1-sulfonate | 2 |
| PAG 3 | TDPS-C1 | Toluenediphenyl Sulfonium tris[(trifluoromethyl)sulfonyl]methide | 21.21% |
| PAG 4 | TDPS-C2 | Toluenediphenyl Sulfonium 1,1,2,2-tetrafluoroethanesulfonic acid | 15.67% |
| PAG 5 | PM2808 | phenylthiophenyldiphenylsulfonium 4-dodecylbenzensulfonate | 100% |
| PAG 6 | 1F-PFOS | 2,4,6-trimethylphenyldiphenylsulfonium perfluorooctanesulfonate | 2 |
| PAG7 | 1A-PFOS | Toluenediphenyl Sulfoniumperfluorooctanesulfonate | 14.2 |

PAG4 was synthesized following literature procedure using tetrafluoroethanesulfonic acid (Y. Endo; K. Shudo and T. Okamoto Chem. Pharm. Bull. 1981, 29, 3753). Other materials were commercially obtained.

TABLE 2A

Quenchers in photoresist composition

| Code | Name | Commercial name/Description | % solids in PGMEA solution |
|---|---|---|---|
| Q1 | DBU | 1,8-Diazabicyclo[5.4.0]undec-7-ene | 1 |
| Q2 | DCMA | N,N-Dicyclohexylmethylamine | 0.5 |
| Q3 | TPI | 2,4,5-Triphenylimidazole | 0.5 |

TABLE 3

Additives

| Code | Commercial name/Description | % solids in PGMEA solution |
|---|---|---|
| ADD1 | Salt of p-Toluenesulfonic Acid and DBU | 1 |
| ADD2 | Salt of MethanesulfonicAcid and DBU | 1 |
| ADD3 | Salt of Camphor sulfonic Acid and DBU | 1 |
| ADD4 | Salt of Dodecylbenzenesulfonic Acid and DBU | 1 |
| ADD5 | TPI-Nonaflate salt | 1 |
| ADD6 | Salt of Camphor sulfonic Acid and DBN | 1 |
| ADD7 | salt of 2-ethylhexanoic acid and DBU | 1 |
| ADD8 | Salt of p-Toluenesulfonic Acid and 2-Methyl-2-thiazoline | 1 |
| ADD9 | Salt of Bis(trifluoromethylsulfonyl)amine and 1,1,2,3,3-pentamethylguanidine | 1 |
| ADD10 | tris[(trifluoromethyl)sulfonyl]methane and 2,4,4-trimethyl-4,5-dihydro-1,3-oxazole salt | 1 |
| ADD11 | Salt of cyclohexylsulfamic acid and 1,3,4,6,7,8-hexahydro-2H-pyrimido[1,2-a]pyrimidine salt | 1 |
| ADD12 | Salt Methyl hydrogen sulfate and 2,3,4,7,8,9-hexahydro-6H-pyrido[1,2-a]pyrimidin-6-one salt | 1 |

DBU = 1,8-diazabicyclo[5.4.0]undec-7-ene
DBN = 1,5-diazabicyclo[4.3.0]non-5-ene

Synthesis of Ionic Additives

Salt of p-Toluenesulfonic Acid and DBU (ADD1)

Methanolic DBU solution (15.35 g, 0.1 mol in 50 ml of methanol) was added to a solution of p-TSA (p-toluenesulfonic acid, 19.2 g, 0.1 mol in 50 ml of methanol) in a 250 ml RB flask. The solution was stirred at room temperature for 3 hours and then the solution was concentrated under vacuum. A very high viscosity liquid was obtained. The viscous liquid was washed with 100 ml of ethyl acetate (warm). The viscous liquid was allowed to solidify. The solid was dissolved in 150 ml of hot acetone. Upon cooling, white crystals were formed.

The solid was isolated by filtration and dried in air under suction. Yield: 27 g (1st crop, 84%). Mp 107.5° C. Similarly, the salt of camphorsulfonic acid and DBU (ADDS) was obtained.

Salt of Methanesulfonic Acid and DBU (ADD2)

A solution of methanesulfonic acid in PGMEA was mixed with an equimolar amount of DBU in PGMEA and diluted to 1% by weight.

Salt of Dodecylbenzenesulfonic Acid and DBU (ADD4)

DBU solution (5 g, 32.8 mmol in 10 ml of isopropanol (IPA)) was added to a solution of DDBSA (dodecylbenzenesulfonic acid, 15.32 g, 32.8 mmol in 70 wt % in IPA) diluted with 20 ml of IPA in a 100 ml RB flask. The solution was stirred at room temperature for 6 hours and then the solution was concentrated under vacuum. A very high viscosity liquid was obtained. The viscous liquid was washed with 50 ml of warm heptane. Then, the viscous liquid was further dried in high vacuum at 50° C. for 1 hour. For some experiments, the material was then dissolved in PGMEA. Alternatively, the viscous liquid was dissolved in 60 ml of PGME, concentrated under vacuum to remove residual water and IPA and some PGME, and finally made into a 20 wt % solution by adding small amounts of PGME.

Salt of Nonafluorobutanesulphonic Acid and TPI (ADDS)

A solution of Nonafluorobutanesulphonic acid in PGMEA was mixed with an equimolar amount of 2,4,5-triphenylimidazole (TPI) in PGMEA and diluted to 1% by weight.

Salt of Camphorsulfonic Acid and DBN (ADD6)

The salt of camphorsulfonic acid and DBN (ADD6) was synthesized following literature procedure. (Proceedings, SPIE" Vol. 3333 (1998), pages 236 to 244).

Salt of 2-ethylhexanoic Acid and DBU (ADD7)

The salt of 2-ethylhexanoic acid and DBU (ADD7) was obtained from Sigma-Aldrich, Inc.

Salts ADD8-ADD12

A solution of salt ADD8 is prepared by mixing p-Toluenesulfonic Acid and 2-Methyl-2-thiazoline in PGMEA. Salts ADD9-ADD12 are prepared similarly by mixing the appropriate acid and base in PGMEA.

General Formulation Procedure

Photoresist components as described in the examples were mixed in an amber-bottle and PGMEA as solvent added to adjust the solid content of solution and stirred until a homogeneous solution was obtained. The solution was filtered through a 0.2 μm filter into a clean amber-bottle.

TABLE 4

Formulation Examples 40 to 48

| Form Ex. # | Polymer (g) | PAG (g) | Quencher (g) | Additive (g) | Solvent (g) | PF6320 (1% in PGMEA) (g) |
|---|---|---|---|---|---|---|
| F1 | P6 (16.78) | PAG1 (5.2) | Q1 (1.27) | none | PGMEA (76.75) | |
| F2 | P6 (16.78) | PAG1 (5.2) | Q1 (1.27) | ADD1 (2.85) | PGMEA (73.90) | |
| F3 | P6 (16.78) | PAG1 (5.2) | Q1 (1.27) | ADD2 (2.07) | PGMEA (74.67) | |
| F4 | P6 (16.78) | PAG1 (5.2) | Q1 (1.27) | ADD3 (3.20) | PGMEA (73.55) | |
| F5 | P6 (16.78) | PAG1 (5.2) | Q1 (1.27) | ADD4 (3.99) | PGMEA (72.76) | |
| F6 | P2 (25.44) | PAG1 (6.4) | Q1 (1.56) | none | PGMEA (66.60) | |
| F7 | P2 (25.44) | PAG1 (6.4) | Q1 (1.56) | ADD1 (0.9) | PGMEA (65.70) | |
| F8 | P2 (25.44) | PAG1 (6.4) | Q1 (1.56) | ADD1 (1.80) | PGMEA (64.80) | |
| F9 | P2 (25.44) | PAG1 (6.4) | Q1 (1.56) | ADD1 (3.60) | PGMEA (63.00) | |
| F18 | P9 (11.35) | PAG3 (0.566) | Q2 (0.681) | ADD1* (0.113) | PGMEA (3.68) PGME (3.41) | 0.206 |
| F19 | P9 (11.34) | PAG3 (0.566) | Q2 (0.681) | ADD1* (0.226) | PGMEA (3.68) PGME (3.30) | 0.206 |
| F20 | P9 (11.34) | PAG3 (0.566) | Q2 (0.681) | ADD1* (0.339) | PGMEA (3.69) PGME (3.18) | 0.206 |
| F21 | P9 (10.21) P11 (0.227) | PAG3 (0.566) | Q2 (0.681) | ADD1* (0.226) | PGMEA (4.59) PGME (3.30) | 0.206 |
| F22 | P9 (9.08) P11 (0.454) | PAG3 (0.566) | Q2 (0.681) | ADD1* (0.226) | PGMEA (5.50) PGME (3.30) | 0.206 |
| F24 | P-9 (37.66) | PAG5 (0.51) | Q3 (5.10) | ADD6 (5.13) | PGMEA (33.2) PGME (16.60) | 1.275 |
| F26 | P-15 (22.5) | PAG1 (2.27) PAG6 (0.75) | Q1 (3.8) | — | PGMEA (17.7) MAK (47) | — |
| F27 | P-15 (22.5) | PAG1 (2.27) PAG6 (0.75) | — | ADD3 (8.4) | PGMEA (12.0) MAK (47) | — |
| F28 | P-15 (22.5) | PAG1 (2.27) PAG6 (0.75) | — | ADD2 (5.4) | PGMEA (15.0) MAK (47) | — |
| F29 | P-15 (22.5) | PAG1 (2.27) PAG6 (0.75) | — | ADD6 (7.8) | PGMEA (127.6) MAK (47) | — |
| F30 | P-14 (11.02) | PAG7 (2.82) | — | ADD7 (5.81) | PGMEA (80.36) | — |
| F31 | P-15 (19.24) | PAG6 (13.38) PAG7 (1.85) | — | ADD1 (8.51) | PGMEA (57.01) | — |
| F32 | P-15 (19.34) | PAG6 (1.89) PAG7 (13.12) | — | ADD3 (9.75) | PGMEA (55.9) | — |
| F33 | P-14 (19.37) | PAG6 (13.63) PAG7 (1.85) | Q1 (3.79) | — | PGMEA (61.4) | — |
| F34 | P-14 (19.37) | PAG6 (13.63) PAG7 (1.85) | — | ADD3 (9.57) | PGMEA (55.6) | — |

PGME: 1-methoxy propanol; MAK: 2-heptanone

Formulations 1, 6 26, 33 are comparative. PF6320 is a surfactant.

The components of Formulation Examples 42-48 are mixed in an amber-bottle with components and solvent mixture and stirred until a homogeneous solution is obtained. The solution is filtered through a 0.2 μm filter into a clean amber-bottle.

B. ArF Litho Evaluation on Top of 193 nm UL

Commercially available 193 nm underlayer materials TIS 193UL 52-50 being supplied by FFEM, USA and 193UL-F12 (Underlayer Formulation Example F12, U.S. Patent Application 2008206676) were applied by spin coating on

TABLE 4A

Formulation examples

| Form Ex. # | Polymer (g) | PAG (g) | Quencher (g) | Additive (g) | Solvent (g) | PF6320 (1% in PGMEA) (g) |
|---|---|---|---|---|---|---|
| F40 | P1 (6.20) | PAG2 (6.5) PAG 6 (6.5) | Q1 (1.27) | ADD1 (2.85) | PGMEA 38.3) PGME (19.2) EEP (19.2) | 0.32 |
| F41 | P5 (6.20) | PAG1 (5.2) | Q1 (1.27) | ADD1 (1.42) ADD3 (1.42) | PGMEA (42.2) PGME (21.1) MAK (21.1) | 0.32 |
| F42 | P10 (14.8) | PAG1 (5.2) | Q1 (1.27) | ADD8 (2.85) | PGMEA (63.3) PGME (21.1) | 0.32 |
| F43 | P12 (6.20) | PAG1 (5.2) | Q1 (1.27) | ADD9 (2.85) | PGMEA (56.3) PGME (28.16) | 0.32 |
| F44 | P13 (6.20) | PAG1 (5.2) | Q1 (1.27) | ADD10 (2.85) | PGMEA (56.3) PGME (28.16) | 0.32 |
| F45 | P18 (6.20) | PAG1 (5.2) | Q1 (1.27) | ADD11 (2.85) | PGMEA (56.3) PGME (28.16) | 0.32 |
| F46 | P13 (4.12) P18 (2.06) | PAG1 (5.2) | Q1 (1.27) | ADD12 (2.85) | PGMEA (56.3) PGME (28.16) | 0.32 |
| F47 | P-16 (5.54) | PAG1 (2.27) PAG6 (0.75) | — | ADD3 (8.4) | PGMEA (39.0) MAK (39.0) | |
| F48 | P-17 (5.54) | PAG1 (2.27) PAG6 (0.75) | — | ADD3 (8.4) | PGMEA (39.0) MAK (39.0) | |

General Lithographic Procedures

A. KrF Evaluation on Top of Bare Si or DUV Organic BARC

The bare silicon wafers were primed by HMDS. For the evaluation on top of KrF organic antireflection coating the commercially available KrF BARC DUV44 (from Brewer Science, Inc.) was applied by spin coating on top of bare Si wafers and then cured at 205° C. for 90 s. The resist samples were then applied over the HMDS primed wafer or over wafer coated with KrF BARC according Table 5 and prebaked on a hotplate for 90 seconds (temperature setting depended on the particular example) resulting in the desired resist film thickness.

The resist samples were then exposed pattern-wise with a KrF excimer laser beam (248 nm) in a Canon FPA-3000 EX6 stepper through a photo mask containing a line/space pattern. A numerical aperture of 0.65NA was utilized with illumination setting according Table 5 (Litho examples L1 to L24). The exposed resist coated wafers were then subjected to PEB treatment on a hot plate (temperature setting depended on the particular example). A 60 second puddle development treatment with a 0.262 N solution of tetramethylammonium hydroxide followed. Then, the wafers were subjected to rinse with distilled water for 15 sec and after that spin dried for 30 second. The data was collected using a Hitachi Scanning Electron Microscope. The resist images were sheared cross-sectionally, and the images were magnified 80K times.

top of bare Si wafers and then cured at 205° C. for 90 s. The spin speed of UL coating was adjusted to give target post cure thickness 210 nm for TIS 193UL 52-50 and 160 nm for 193UL-F45. The resist samples were then applied over the 193 nm UL coated wafer and prebaked on a hotplate for 90 seconds (temperature setting depended on the particular example) resulting in the desired resist film thickness. The resist sample F30 was exposed pattern-wise with an ArF excimer laser beam (193 nm) in an ISI 193 nm stepper through a photo mask containing a line/space. A numerical aperture of 0.6NA was utilized with illumination setting according Table 5. (Litho Example L31). Resist samples F26-F29 (Litho examples L27-L29) and F31-F34 (Litho Examples L32-L35) were exposed pattern-wise with an ArF excimer laser beam (193 nm) in an ASML 193 nm scanner PAS 5500\1100 through a photo mask containing a line/space pattern. A numerical aperture of 0.75NA was utilized with illumination setting according Table 5 (Litho examples L27-L29 and L32 - L35). The exposed resist coated wafers were then subjected to PEB treatment on a hot plate (temperature setting depended on the particular example). A 60 seconds puddle development treatment in a 0.262 N solution of tetramethylammonium hydroxide followed. Then, the wafers were subjected to rinse with distilled water for 15 sec and after that spin dried for 30 second. The data was collected using a Hitachi Scanning Electron Microscope. The resist images were sheared cross-sectionally, and the images were magnified 80K times.

TABLE 5

Lithographic examples

| Litho Example # | Formulation | Substrate | Thickness of resist (nm) | SB(° C.)/PEBT(° C.) Time (s) | Illumination | SIGMA | Target CD(nm) |
|---|---|---|---|---|---|---|---|
| L1 | F1 | Primed Si | 190 | 130/130, 90 | Conv. | 0.6 | 200 |
| L2 | F2 | Primed Si | 190 | 130/130, 90 | Conv. | 0.6 | 200 |
| L3 | F3 | Primed Si | 190 | 130/130, 90 | Conv. | 0.6 | 200 |
| L4 | F4 | Primed Si | 190 | 130/130, 90 | Conv. | 0.6 | 200 |
| L5 | F5 | Primed Si | 190 | 130/130, 90 | Conv. | 0.6 | 200 |
| L6 | F6 | Primed Si | 190 | 130/130, 90 | Conv. | 0.6 | 200 |
| L7 | F7 | Primed Si | 190 | 130/130, 90 | Conv. | 0.6 | 200 |
| L8 | F8 | Primed Si | 190 | 130/130, 90 | Conv. | 0.6 | 200 |
| L9 | F9 | Primed Si | 190 | 130/130, 90 | Conv. | 0.6 | 200 |
| L19 | F18 | Primed Si | 720 | 130/130, 60 | Conv. | 0.5 | 300 |
| L20 | F19 | Primed Si | 720 | 130/130, 60 | Conv. | 0.5 | 300 |
| L21 | F20 | Primed Si | 720 | 130/130, 60 | Conv. | 0.5 | 300 |
| L22 | F21 | Primed Si | 720 | 130/130, 60 | Conv. | 0.5 | 300 |
| L24 | F24 | DUV44(60 nm) | 1180 | 130/130, 60 | Conv. | 0.7 | 300 |
| L27 | F26 | 193UL-F12(160 nm) | 110 | 135/100, 90 | Quadropole | 0.92/0.72 | 400 |
| I28 | F27 | 193UL-F12(160 nm) | 110 | 135/100, 90 | Quadropole | 0.92/0.72 | 300 |
| L29 | F28 | 193UL-F12(160 nm) | 110 | 135/100, 90 | Quadropole | 0.92/0.72 | 120 |
| L30 | F29 | 193UL-F12(160 nm) | 110 | 135/100, 90 | Quadropole | 0.92/0.72 | 130 |
| L31 | F30 | TIS 193UL52-50 | 110 | 120/100, 60 | Annular | 0.8/0.6 | 80 |
| L32 | F31 | 193UL-F12 | 235 | 135/125, 90 | Annular | 0.8/0.45 | 80 |
| L33 | F32 | 193UL-F12 | 235 | 135/125, 90 | Annular | 0.8/0.45 | 80 |
| L34 | F33 | 193TCU-F12 | 235 | 135/125/90 | Annular | 0.8/0.45 | 120 |
| L35 | F34 | 193TCU-F12 | 235 | 135/125/90 | Annular | 0.8/0.45 | 120 |

Target feature for Lithographic Examples L1-L9, L19-L24 and L31 is L/S (1:1); Lithographic Examples L27-L29, L32-L35 is Trenches 1:1.
SB/PEBT: soft bake temperature/post exposure bake temperature Lithographic Examples 1, 6, 27 and 34 are comparative examples.

TABLE 6

Lithographic examples

| Litho Example # | Formulation | Photospeed E1:1, mJ/cm² | RES (nm) | EL (%) | DOF (μm) | Comments on profile |
|---|---|---|---|---|---|---|
| L1 | F1 | 17 | 190 | 11.8 | 0.4 | severe standing waves |
| L2 | F2 | 12 | 190 | 16.7 | 0.5 | smooth profiles |
| L3 | F3 | 21 | 190 | 9.5 | 0.6 | standing waves |
| L4 | F4 | 18 | — | — | — | standing waves |
| L5 | F5 | 10 | — | — | — | severe standing waves |
| L6 | F6 | 13 | 190 | 7.7 | 0.4 | severe standing waves |
| L7 | F7 | 11.5 | 190 | 10.9 | 0.5 | small standing waves |
| L8 | F8 | 11 | 180 | 11.4 | 0.7 | small standing waves |
| L9 | F9 | 10.5 | 180 | 11.9 | 0.7 | smooth profile |
| L19 | F18 | 13 | 190 | 27.3 | 1 | small standing waves |
| L20 | F19 | 13 | 210 | 26.3 | 1.2 | smooth profile |
| L21 | F20 | 12 | 220 | 23.5 | 1.1 | smooth profile |
| L22 | F21 | 13 | 220 | 28.2 | 1.2 | smooth profile |
| L24 | F24 | 36 | — | — | 1 | vertical, smooth profile t-topping |
| L27 | F26 | 32 | 80 | 9.4 | 0.6 | Slightly rounded profile, footing |
| L28 | F27 | 27 | 80 | 14.8 | 0.6 | More vertical profile, footing |
| L29 | F28 | 25 | 75 | 16 | 0.6 | More vertical profile, footing |
| L30 | F29 | 27 | 75 | 14.8 | 0.7 | Vertical and smooth profile, footing |
| L31 | F30 | 33 | 110 | — | — | vertical and smooth lines, slightly rounded |
| L32 | F31 | 40 | 110 | 22.5 | 0.5 | smooth lines, slightly rounded |
| L33 | F32 | 39 | 110 | 18.2 | 0.5 | vertical, smooth profiles |
| L34 | F33 | 34.82 | — | — | — | — |
| L35 | F34 | 36.28 | — | — | — | — |

Lithographic Examples 1, 6, 27 and 34 are comparative examples.

Formulations F40-F46 (Litho example L40-L46) are lithographically processed in the same manner as Litho example L1 using KrF excimer laser beam (248 nm) in a Canon FPA-3000 EX6 stepper through a photo mask containing a line/space pattern. Formulations F47-F48 (Litho example L47-L48) are exposed pattern-wise with an ArF excimer laser beam (193 nm) in the same manner as Litho Example L27. The data are summarized in Table 6A.

TABLE 6A

Lithographic examples

| Formulation | Photospeed E1:1, mJ/cm² | RES (nm) | EL (%) | DOF (μm) | Comments on profile |
|---|---|---|---|---|---|
| F40 | 11 | 180 | 21.3 | 0.6 | smooth profiles |
| F41 | 11 | 185 | 20.6 | 0.6 | smooth profiles |
| F42 | 12 | 180 | 20 | 0.6 | smooth profiles |
| F43 | 13 | 190 | 16.4 | 0.5 | slight rough profiles |
| F44 | 14 | 195 | 15.7 | 0.6 | slight rough profiles |
| F45 | 12 | 190 | 13.4 | 0.5 | slight rough profiles |
| F46 | 17 | 200 | 14.3 | 0.4 | slight footing |
| F47 | 33 | 85 | 9.4 | 0.7 | Slightly rounded profile, footing |
| F48 | 36 | 95 | 8.6 | 0.4 | Slightly rounded profile, strong footing |

Procedure for Aging Stability Evaluation of Resists Comprising Maleic Anhydride Based Resin Binders The increase of acidity in photoresist as measured by titration provides convenient way to track the aging process of resists based on polymers with anhydride or lactone groups.

The resist solution (3-4 g, accurate weight) was diluted with 15 ml of acetone and 10 ml of acetonitrile and then 125 mg of barium perchlorate solid was added to the diluted solution. The liberated perchloric acid solution was titrated potentiometrically by 0.1 M tri-n-propylamine in acetone. The amount of acrylic acid was calculated from the break point of the curve. (see Table 7)

Lithographic processing was carried out on the stabilized (with salt, F34) and unstabilized (without salt, F33) formulations using the procedure described for Litho examples 34 and 35. Samples were aged for 6 weeks at 20° C. or 30° C. and then submitted for lithography. Data for resist without aging is reproduced from Table 6.

TABLE 7

Aging stability of Resist Formulations

| Test parameter | Acidity as % of solids | | | Photospeed as E 1:1(mJ/cm²) | | |
|---|---|---|---|---|---|---|
| Storage conditions | | 20° C. | 30° C. | | 20° C. | 30° C. |
| Time of aging | 0 | 6 weeks | 6 weeks | 0 | 6 weeks | 6 weeks |
| F33/L34 | 0.67 | 1.97 | 2.52 | 36.28 | 33.36 (−8.04%) | 32.3 (−10.97%) |
| F34/L35 | 0.55 | 0.75 | 1.03 | 34.82 | 34.89 (+0.20%) | 34.66 (−0.01%) |

Formulation example F33/Litho example 34 is a comparative example

As shown the results above, the photospeed of the formulation containing the iminium salt was essentially the same after 6 weeks while the sample without iminium salt became 8-11% faster.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:

1. A photoresist composition, comprising:

one or more resin binders that include one or more acid sensitive protecting groups and that are substantially free of phenolic groups protected by acetal or ketal groups and wherein the binder becomes alkali-soluble by the action of an acid to remove the acid sensitive protecting groups;

one or more photo acid generators, that, upon exposure to a source of high energy, decompose and generate a photoacid strong enough to remove the one or more acid sensitive groups;

one or more ionic non-photosensitive additives of an iminium salt; and one or more solvents, wherein the iminium salt is selected from the group consisting of a salt of structure $I_0$ ($B^+A_0^-$) wherein $B^+$ is

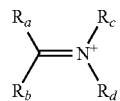

wherein $B^+$ is substituted with one or more additional N, S or O atoms, wherein $R_a$ and $R_b$, are substituted or unsubstituted alkyl groups that optionally include one or more carbonyl groups, one or more S atoms, one or more O atoms, or one or more $NR_e$ groups within the chain; wherein $R_c$ and $R_d$ are independently selected from the group consisting of hydrogen and an alkyl group, and, if an alkyl group, can optionally include one or more S atoms, one or more O atoms, or one or more $NR_e$ groups; wherein $R_a$ and $R_b$, or $R_a$ and $R_c$, or $R_c$ and $R_d$, or $R_b$ and $R_d$ optionally form a 5-7 membered ring, and wherein $R_e$ is selected from the group consisting of hydrogen and an alkyl group; and $A_0^-$ is selected from the group consisting of an organic sulfonic acid anion, a sulfamic acid anion, a carboxylic anion, an alkyl sulfate anion, a bis sulfonylimide anion, and a tris sulfonyl methide anion, a salt of the structure:

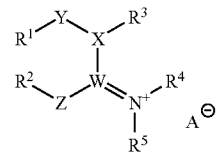

wherein W is a carbon atom, X is a selected from the group consisting of a $R^6C$ group, a nitrogen atom, and oxygen atom and a sulfur atom, Y is selected from the group consisting of a $(R^7)_2C$, a carbonyl group, an S atom and an O atom, Z is selected from the group consisting of a $(R^8)_2C$ group, a $R^9N$, an S atom and an O atom, $R^1$ to $R^9$ are each independently selected from the group consisting of a hydrogen atom, $C_1$-$C_3$ carbon chain and a 5 to 7 member ring, $R^1$ and $R^2$ may be connected together to form a 5-7 member ring, $R^3$ and $R^4$ may form a 5-7 member ring if connected together, $A^-$ is selected from the group consisting of an organic sulfonic acid anion $(R^{11}SO_3^-)$, a sulfamic acid anion $[R^{12}N(R^{13})SO_3^-]$, a carboxylic acid anion $(R^{14}CO_2^-)$, an alkyl sulfate anion $(R^{15}SO_4^-)$, a bis sulfonyl imide anion $[(R^{16}SO_2)_2N^-]$, and a tris sulfonyl methide anion $[(R^{16}SO_2)_3C^-]$; where $R^{11}$, $R^{12}$, $R^{13}$, $R^{14}$ and $R^{15}$ are each independently selected from the group consisting of a $C_1$-$C_{24}$ carbon chain, a partially or fully halogen substituted carbon chain, unsubstituted or substituted $C_6$-$C_{20}$ aromatic carbon group, and combinations thereof, optionally containing S or N or any organic functional group that may interrupt the skeletal chain; $R^{16}$ is independently selected from the group consisting of highly fluorinated or perfluorinated alkyl and fluorinated aryl groups and may be cyclic, when a combination of any two $R^{16}$ groups are linked to form a bridge, further, the $R^{16}$ alkyl chains contain from 1-20 carbon atoms and may be straight, branched, or cyclic, such that divalent oxygen, trivalent nitrogen or hexavalent sulfur may interrupt the skeletal chain, and further when $R^{16}$ contains a cyclic structure, such structure has 5 or 6 ring members, optionally, 1 or 2 of which are N, S or O atoms, and a salt of the structure:

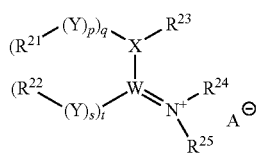

wherein W is a carbon atom, X is selected from the group consisting of a $R^{26}C$ group and a nitrogen atom, Y is selected from the group consisting of a $(R^{27})_2C$, a carbonyl group, an S atom and an O atom, Z is selected from the group consisting of a $(R^{28})_2C$ group, a $R^{29}N$ group, an S atom and an O atom, $R^{21}$ to $R^{27}$ and $R^{29}$ are each independently selected from the group consisting of a hydrogen atom, a phenyl group, and a $C_1$-$C_3$ carbon chain optionally substituted with a phenyl group or a 5 to 7 member ring, $R^{21}$ and $R^{22}$ may be connected together to form a 5-7 member ring, $R^{23}$ and $R^{24}$ may form a 5-7 member ring if connected together, p and s are each independently 0 or 1, and q and t are each independently 1, $R^{28}$ is selected from the group consisting of a hydrogen atom and a $C_1$-$C_3$ carbon chain optionally substituted with a phenyl group or a 5 to 7 member ring; and $A^-$ is selected from the group consisting of an organic sulfonic acid anion $(R^{11}SO_3^-)$, a sulfamic acid anion $[R^{12}N(R^{13})SO_3^-]$ a carboxylic acid anion $(R^{14}CO_2^-)$, an alkyl sulfate anion $(R^{15}SO_4^-)$, a bis sulfonyl imide anion $[(R^{16}SO_2)_2N^-]$, and a tris sulfonyl methide anion $[(R^{16}SO_2)_3C^-]$.

2. The composition of claim 1, wherein a cation of the iminium salt is substituted with one or more additional N, S or O atoms.

3. The composition of claim 1, further comprising at least one base as a quencher.

4. The composition of claim 1, further comprising a sensitizer.

5. The composition of claim 1, further comprising one or more surfactants.

6. The composition of claim 1, wherein the iminium salt is of structure $I_0$ $(B^+A_0^-)$, wherein $B^+$ is

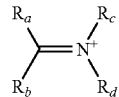

wherein $B^+$ is substituted with one or more additional N, S or O atoms, wherein $R_a$ and $R_b$, are substituted or unsubstituted alkyl groups that optionally include one or more carbonyl groups, one or more S atoms, one or more O atoms, or one or more $NR_e$ groups within the chain; wherein $R_c$ and $R_d$ are independently selected from hydrogen and an alkyl group, and, if an alkyl group, can optionally include one or more S atoms, one or more O atoms, or one or more $NR_e$ groups; wherein $R_a$ and $R_b$, or $R_a$ and $R_c$, or $R_c$ and $R_d$, or $R_b$ and $R_d$ optionally form a 5-7 membered ring, and wherein $R_e$ is selected from the group consisting of hydrogen and an alkyl group; and $A_0^-$ is selected from the group consisting of compounds having an organic sulfonic acid anion, compounds having a sulfamic acid anion, compounds having a carboxylic anion, an alkyl sulfate anion, compounds having a bis sulfonylimide anion, and compounds having a tris sulfonyl methide anion.

7. The composition of claim 6 wherein $A_0^-$ is an organic sulfonic acid anion.

8. The composition of claim 6 wherein $A_0^-$ is a tris sulfonyl methide anion.

9. The composition of claim 6 wherein $A_0^-$ is selected from the group consisting of a sulfamic acid anion, a carboxylic anion, an alkyl sulfate anion, and a bis sulfonylimide anion.

10. The composition of claim 1, wherein the iminium salt is a salt of the structure

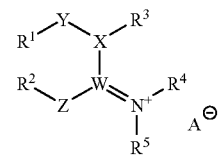

wherein W is a carbon atom, X is selected from the group consisting of a $R^6C$ group and a nitrogen atom, Y is selected from the group consisting of a $(R^7)_2C$, a carbonyl group, an S atom and an O atom, Z is selected from the group consisting of a $(R^8)_2C$ group, a $R^9N$, an S atom and an O atom, $R^1$ to $R^9$ are each independently selected from the group consisting of a hydrogen atom, $C_1$-$C_3$ carbon chain and a 5 to 7 member ring, $R^1$ and $R^2$ may be connected together to form a 5-7 member ring, $R^3$ and $R^4$ may form a 5-7 member ring if connected together, $A^-$ is selected from the group consisting of an organic sulfonic acid anion $(R^{11}SO_3^-)$, a sulfamic acid anion $[R^{12}N(R^{33})SO_3^-]$, a carboxylic acid anion $(R^{14}CO_2^-)$, an alkyl sulfate anion $(R^{15}SO_4^-)$, a bis sulfonyl imide anion $[(R^{16}SO_2)_2N^-]$, and a tris sulfonyl methide anion $[(R^{16}SO_2)_3C^-]$; where $R^{11}$, $R^{12}$, $R^{13}$, $R^{14}$ and $R^{15}$ are each independently selected from the group consisting of a $C_1$-$C_{24}$ carbon chain, a partially or fully halogen substituted carbon chain, unsubstituted or substituted $C_6$-$C_{20}$ aromatic carbon group, and combinations thereof, optionally containing S or N or any organic functional group that may interrupt the skeletal chain; $R^{16}$ is independently selected from the group consisting of highly fluorinated or perfluorinated alkyl and fluorinated aryl groups and may be cyclic, when a combination of any two $R^{16}$ groups are linked to form a bridge, further, the $R^{16}$ alkyl chains contain from 1-20 carbon atoms and may be straight, branched, or cyclic, such that divalent oxygen, trivalent nitrogen or hexavalent sulfur may interrupt the skeletal chain, and further when $R^{16}$ contains a cyclic structure, such structure has 5 or 6 ring members, optionally, 1 or 2 of which are N, S or O atoms.

11. The composition of claim 10 wherein $A^-$ is an organic sulfonic acid anion.

12. The composition of claim 10 wherein $A^-$ is a tris sulfonyl methide anion.

13. The composition of claim 10 wherein $A^-$ is selected from the group consisting of a sulfamic acid anion, a carboxylic anion, an alkyl sulfate anion, and a bis sulfonylimide anion.

14. A composition of claim 1 wherein the iminium salt is a salt of the structure

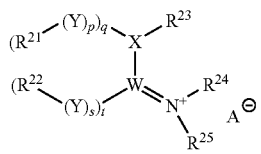

wherein W is a carbon atom, X is selected from the group consisting of a $R^{26}C$ group, a nitrogen atom, an oxygen atom and a sulfur atom, Y is selected from the group consisting of a $(R^{27})_2C$, a carbonyl group, an S atom and an O atom, Z is selected from the group consisting of a $(R^{28})_2C$ group, a $R^{29}N$ group, an S atom and an O atom, $R^{41}$ to $R^{29}$ are each independently selected from the group consisting of a hydrogen atom, a phenyl group, and a $C_1$-$C_3$ carbon chain optionally substituted with a phenyl group or a 5 to 7 member ring, $R^{21}$ and $R^{22}$ may be connected together to form a 5-7 member ring, $R^{23}$ and $R^{24}$ may form a 5-7 member ring if connected together, p and s are each independently 0 or 1, and q and t are each independently 1; and $A^-$ is selected from the group consisting of an organic sulfonic acid anion ($R^{11}SO_3^-$), a sulfamic acid anion $[R^{12}N(R^{13})SO_3^-]$, a carboxylic acid anion ($R^{14}CO_2^-$), an alkyl sulfate anion ($R^{15}SO_4^-$), a bis sulfonyl imide anion $[(R^{16}SO_2)_2N^-]$ and a tris sulfonyl methide anion $[(R^{16}SO_2)_3C^-]$.

15. The composition of claim 14 wherein $A^-$ is an organic sulfonic acid anion.

16. The composition of claim 14 wherein $A^-$ is a tris sulfonyl methide anion.

17. The composition of claim 14 wherein $A^-$ is selected from the group consisting of a sulfamic acid anion, a carboxylic anion, an alkyl sulfate anion, and a bis sulfonylimide anion.

18. The composition of claim 1, wherein the acid generated upon photoactivation and $A_0^-$ $H^+$ or $A^-$ $H^+$ differ in pKa values by at least about 0.5.

19. The composition of claim 3, wherein the quencher and a conjugate base of the cation of the iminium salt differ in pKb values by 0.5 or more.

20. A process for patterning relief structures on a substrate, comprising:
(a) providing a substrate;
(b) coating on the substrate a photosensitive composition of claim 1;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

21. A process for patterning relief structures on a substrate, comprising:
(a) providing a substrate;
(b) coating on the substrate a photosensitive composition of claim 6;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

22. A process for patterning relief structures on a substrate, comprising:
(a) providing a substrate;
(b) coating on the substrate a photosensitive composition of claim 10;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

23. A process for patterning relief structures on a substrate, comprising:
(a) providing a substrate;
(b) coating on the substrate a photosensitive composition of claim 14;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

24. A photoresist composition, comprising:
one or more resin binders that include one or more acid sensitive protecting groups and that are substantially free of phenolic groups protected by acetal or ketal groups and wherein the binder becomes alkali-soluble by the action of an acid to remove the acid sensitive protecting groups;
one or more photo acid generators, that, upon exposure to a source of high energy, decompose and generate a photoacid strong enough to remove the one or more acid sensitive groups;
one or more ionic non-photosensitive additives of an iminium salt; and
one or more solvents, wherein the iminium salt is selected from the group consisting of a pyrole salt, an oxazole salt, an imidazole salt, a thiazole salt, a benzimidazole salt, a pyrroline salt and a thiazoline salt, and wherein the iminium salt comprises an anion selected from the group consisting of a sulfamic acid anion, an alkyl sulfate anion, a bis sulfonylimide anion, and a tris sulfonyl methide anion.

25. A process for patterning relief structures on a substrate, comprising:
(a) providing a substrate;
(b) coating on the substrate a photosensitive composition of claim 24;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

26. A photoresist composition, comprising:
one or more resin binders that include one or more acid sensitive protecting groups and that are substantially free of phenolic groups protected by acetal or ketal groups and wherein the binder becomes alkali-soluble by the action of an acid to remove the acid sensitive protecting groups;
one or more photo acid generators, that, upon exposure to a source of high energy, decompose and generate a photoacid strong enough to remove the one or more acid sensitive groups;
one or more ionic non-photosensitive additives of an iminium salt; and
one or more solvents, wherein the iminium salt is selected from the group consisting of a salt of structure $I_0$ $(B^+A_0^-)$, wherein $B^+$ is

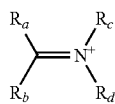

wherein $R_a$ and $R_b$, are substituted or unsubstituted alkyl groups that optionally include one or more carbonyl groups, one or more S atoms, one or more O atoms, or one or more $NR_e$ groups within the chain; wherein $R_c$ and $R_d$ are independently selected from the group consisting of hydrogen and an alkyl group, and, if an alkyl group, can optionally include one or more S atoms, one or more O atoms, or one or more $NR_e$ groups; wherein $R_a$ and $R_b$, or $R_a$ and $R_c$, or $R_c$ and $R_d$, or $R_b$ and $R_d$ optionally form a 5-7 membered ring, and wherein $R_e$ is selected from the group consisting of hydrogen and an alkyl group; and $A_0^-$ is selected from the group consisting of a sulfamic acid anion, an alkyl sulfate anion, a bis sulfonylimide anion, and a tris sulfonyl methide anion, a salt of the structure:

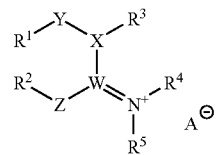

wherein W is a carbon atom, X is selected from the group consisting of a $R^6C$ group, a nitrogen atom, and oxygen atom and a sulfur atom, Y is selected from the group consisting of a $(R^7)_2C$, a carbonyl group, an S atom and an O atom, Z is selected from the group consisting of a $(R^8)_2C$ group, a $R^9N$, an S atom and an O atom, $R^1$ to $R^9$ are each independently selected from the group consisting of a hydrogen atom, $C_1$-$C_3$ carbon chain and a 5 to 7 member ring, $R^1$ and $R^2$ may be connected together to form a 5-7 member ring, $R^3$ and $R^4$ may form a 5-7 member ring if connected together, $A^-$ is selected from the group consisting of an organic sulfonic acid anion $(R^{11}SO_3^-)$, a sulfamic acid anion $[R^{12}N(R^{53})SO_3^-]$, a carboxylic acid anion $(R^{14}CO_2^-)$, an alkyl sulfate anion $(R^{15}SO_4^-)$, a bis sulfonyl imide anion $[(R^{16}SO_2)_2N^-]$, and a tris sulfonyl methide anion $[(R^{16}SO_2)_3C^-]$; where $R^{11}$, $R^{12}$, $R^{13}$, $R^{14}$ and $R^{15}$ are each independently selected from the group consisting of a $C_1$-$C_{24}$ carbon chain, a partially or fully halogen substituted carbon chain, unsubstituted or substituted $C_6$-$C_{20}$ aromatic carbon group, and combinations thereof, optionally containing S or N or any organic functional group that may interrupt the skeletal chain;
$R^{16}$ is independently selected from the group consisting of highly fluorinated or perfluorinated alkyl and fluorinated aryl groups and may be cyclic, when a combination of any two $R^{16}$ groups are linked to form a bridge, further, the $R^{16}$ alkyl chains contain from 1-20 carbon atoms and may be straight, branched, or cyclic, such that divalent oxygen, trivalent nitrogen or hexavalent sulfur may interrupt the skeletal chain, and further when $R^{16}$ contains a cyclic structure, such structure has 5 or 6 ring members, optionally, 1 or 2 of which are N, S or O atoms,
and a salt of the structure:

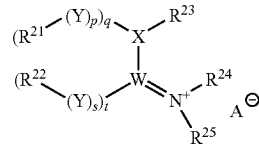

wherein W is a carbon atom, X is selected from the group consisting of a $R^{26}C$ group and a nitrogen atom, Y is selected from the group consisting of a $(R^{27})_2C$, a carbonyl group, an S atom and an O atom, Z is selected from the group consisting of a $(R^{28})_2C$ group, a $R^{29}N$ group, an S atom and an O atom, $R^{61}$ to $R^{27}$ and $R^{29}$ are each independently selected from the group consisting of a hydrogen atom, a phenyl group, and a $C_1$-$C_3$ carbon chain optionally substituted with a phenyl group or a 5 to 7 member ring, $R^{21}$ and $R^{22}$ may be connected together to form a 5-7 member ring, $R^{23}$ and $R^{24}$ may form a 5-7 member ring if connected together, p and s are each independently 0 or 1, and q and t are each independently 1, $R^{28}$ is selected from the group consisting of a hydrogen atom and a $C_1$-$C_3$ carbon chain optionally substituted with a phenyl group or a 5 to 7 member ring; and $A^-$ is selected from the group consisting of an organic sulfonic acid anion $(R^{11}SO_3^-)$, a sulfamic acid anion $[R^{12}N(R^{13})SO_3^-]$, a carboxylic acid anion $(R^{14}CO_2^-)$, an alkyl sulfate anion $(R^{15}SO_4^-)$, a bis sulfonyl imide anion $[(R^{16}SO_2)_2N^-]$, and a tris sulfonyl methide anion $[(R^{16}SO_2)_3C^-]$.

27. A process for patterning relief structures on a substrate, comprising:
(a) providing a substrate;
(b) coating on the substrate a photosensitive composition of claim 26;
(c) baking the photosensitive composition to provide a photosensitive film on the substrate;
(d) exposing the photosensitive film to imaging radiation;
(e) developing the photosensitive film making a portion of the underlying substrate visible; and
(f) rinsing the substrate.

* * * * *